United States Patent
Leigh et al.

(10) Patent No.: US 10,004,164 B2
(45) Date of Patent: Jun. 19, 2018

(54) PLENUMS FOR REMOVABLE MODULES

(71) Applicant: HEWLETT PACKARD ENTERPRISE DEVELOPMENT LP, Houston, TX (US)

(72) Inventors: Kevin B Leigh, Houston, TX (US); George D Megason, Spring, TX (US); David W Sherrod, Tomball, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 526 days.

(21) Appl. No.: 14/416,076

(22) PCT Filed: Sep. 28, 2012

(86) PCT No.: PCT/US2012/057815
§ 371 (c)(1),
(2) Date: Jan. 21, 2015

(87) PCT Pub. No.: WO2014/051607
PCT Pub. Date: Apr. 3, 2014

(65) Prior Publication Data
US 2015/0208554 A1 Jul. 23, 2015

(51) Int. Cl.
*H05K 7/20* (2006.01)
*G06F 1/20* (2006.01)
(52) U.S. Cl.
CPC ......... *H05K 7/20754* (2013.01); *G06F 1/20* (2013.01); *H05K 7/20172* (2013.01); *H05K 7/20572* (2013.01); *H05K 7/20727* (2013.01); *H05K 7/20736* (2013.01)

(58) Field of Classification Search
CPC ... H05K 7/20; H05K 7/20009; H05K 7/20136
USPC .......... 454/184; 361/679.48, 679.46, 679.51, 361/690, 694, 695
See application file for complete search history.

(56) References Cited

U.S. PATENT DOCUMENTS

| | | | |
|---|---|---|---|
| 3,956,673 A | 5/1976 | Seid | |
| 6,462,944 B1 | 10/2002 | Lin | |
| 6,525,935 B2 | 2/2003 | Casebolt | |
| 6,525,936 B2 | 2/2003 | Heitelmal et al. | |

(Continued)

FOREIGN PATENT DOCUMENTS

| CA | 2531936 A1 | 6/2006 |
|---|---|---|
| CN | 1947481 A | 4/2007 |

(Continued)

OTHER PUBLICATIONS

PCT/ISA/KR, International Search Report dated Apr. 30, 2013, PCT/US2012/057815, 9pps.

*Primary Examiner* — Steven B McAllister
*Assistant Examiner* — Ko-Wei Lin
(74) *Attorney, Agent, or Firm* — Hewlett Packard Enterprise Patent Development

(57) ABSTRACT

A rack frame includes a first plenum to serve as a first structural member and to supply air based on a blind-mate supply interface. A second plenum is to serve as a second structural member and to exhaust air based on a blind-mate exhaust interface. The first plenum is to structurally support and supply air for a removable module, and the second plenum is to structurally support and exhaust air from the removable module.

9 Claims, 18 Drawing Sheets

(56) References Cited

U.S. PATENT DOCUMENTS

| | | | |
|---|---|---|---|
| 6,628,520 B2 * | 9/2003 | Patel | H05K 7/20754 165/104.32 |
| 6,876,549 B2 | 4/2005 | Beitelmal et al. | |
| 6,882,531 B2 | 4/2005 | Modica | |
| 6,904,968 B2 | 6/2005 | Beitelmal et al. | |
| 7,226,353 B2 | 6/2007 | Bettridge et al. | |
| 7,295,444 B1 | 11/2007 | Wang | |
| 7,324,336 B2 | 1/2008 | Vos et al. | |
| 7,434,412 B1 | 10/2008 | Miyahira | |
| 7,552,758 B2 | 6/2009 | Garner et al. | |
| 7,646,603 B2 * | 1/2010 | Bard | H05K 7/20181 165/104.33 |
| 7,660,116 B2 | 2/2010 | Ciassen et al. | |
| 7,735,261 B2 * | 6/2010 | Sellati | E05C 19/006 292/DIG. 11 |
| 8,031,468 B2 | 10/2011 | Bean, Jr. et al. | |
| 8,408,356 B2 * | 4/2013 | Yamaguchi | H05K 7/20736 181/198 |
| 2003/0150231 A1 | 8/2003 | Spinazzola et al. | |
| 2005/0153649 A1 | 7/2005 | Bettridge et al. | |
| 2006/0141921 A1 | 6/2006 | Turek et al. | |
| 2008/0239659 A1 | 10/2008 | Kundapur | |
| 2009/0097204 A1 | 4/2009 | Byers | |
| 2009/0262501 A1 | 10/2009 | Claassen et al. | |
| 2011/0069450 A1 | 3/2011 | Adducci et al. | |
| 2011/0103009 A1 | 5/2011 | Julien-Roux et al. | |
| 2011/0128699 A1 * | 6/2011 | Heydari | H05K 7/20745 361/679.48 |
| 2011/0267775 A1 | 11/2011 | VanDerVeen et al. | |
| 2011/0288664 A1 | 11/2011 | Archibald et al. | |
| 2011/0291852 A1 * | 12/2011 | Forristal | H05K 7/186 340/686.1 |
| 2012/0140403 A1 | 6/2012 | Lau et al. | |

FOREIGN PATENT DOCUMENTS

| | | |
|---|---|---|
| CN | 101801165 B | 8/2010 |
| KR | 10-2012-0072880 A | 7/2012 |
| KR | 2012-0072880 | 7/2012 |
| WO | WO-2010/040868 A1 | 4/2010 |
| WO | WO-2010040868 | 4/2010 |

* cited by examiner

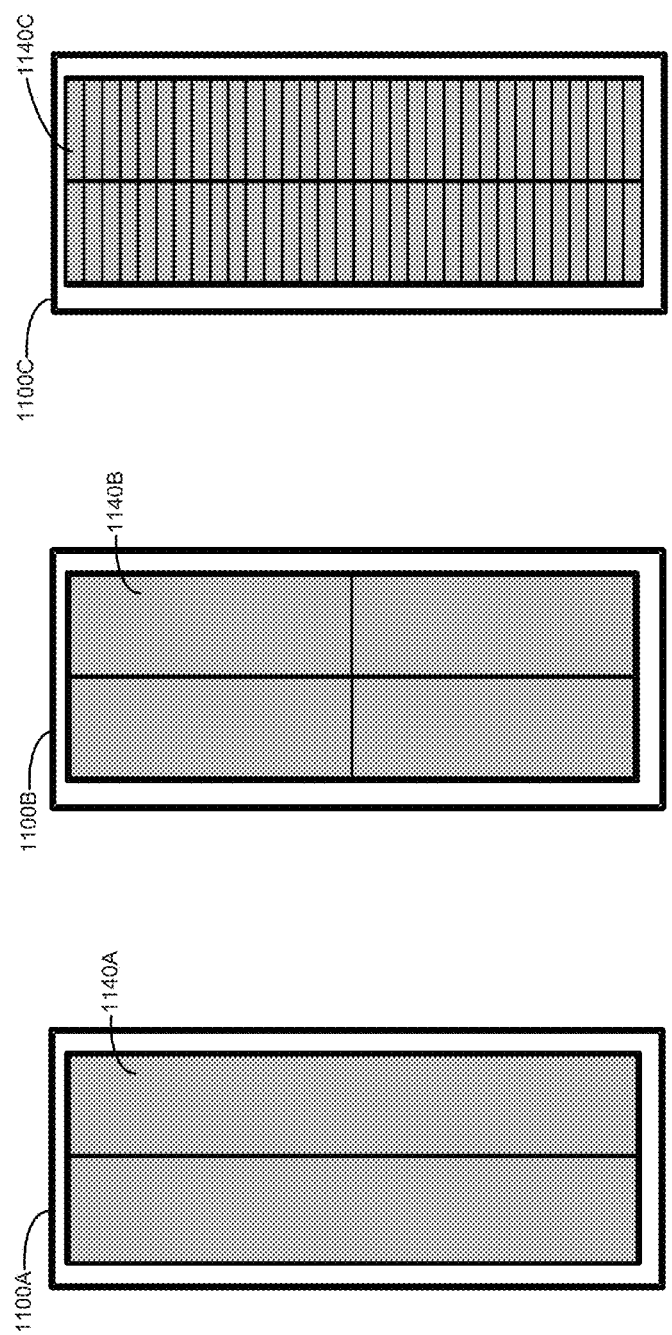

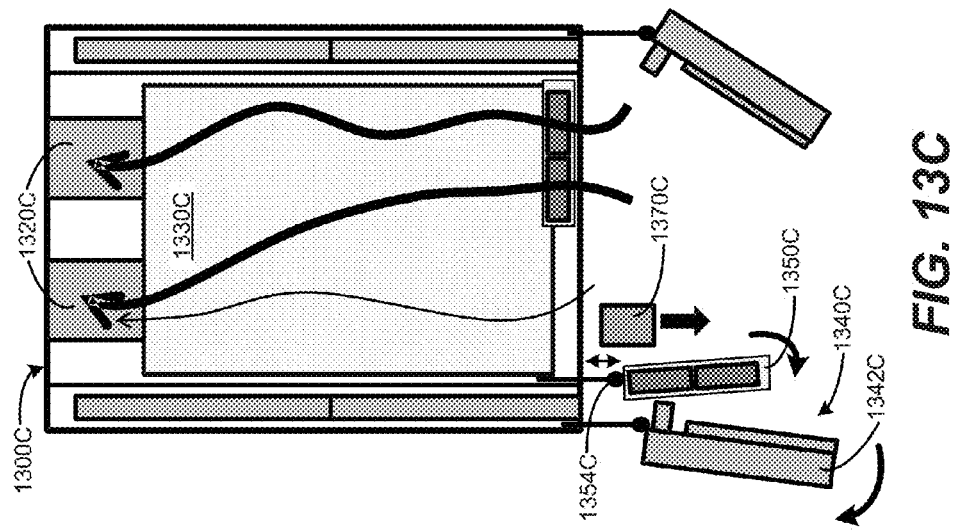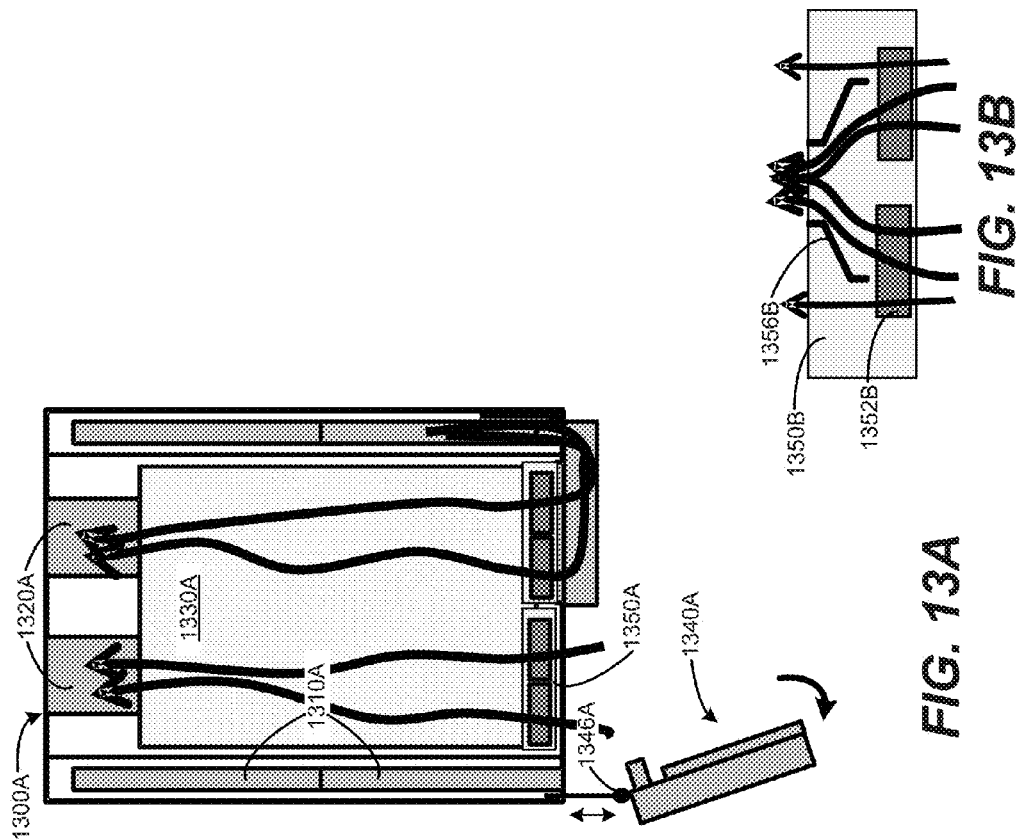
FIG. 13A  FIG. 13B  FIG. 13C

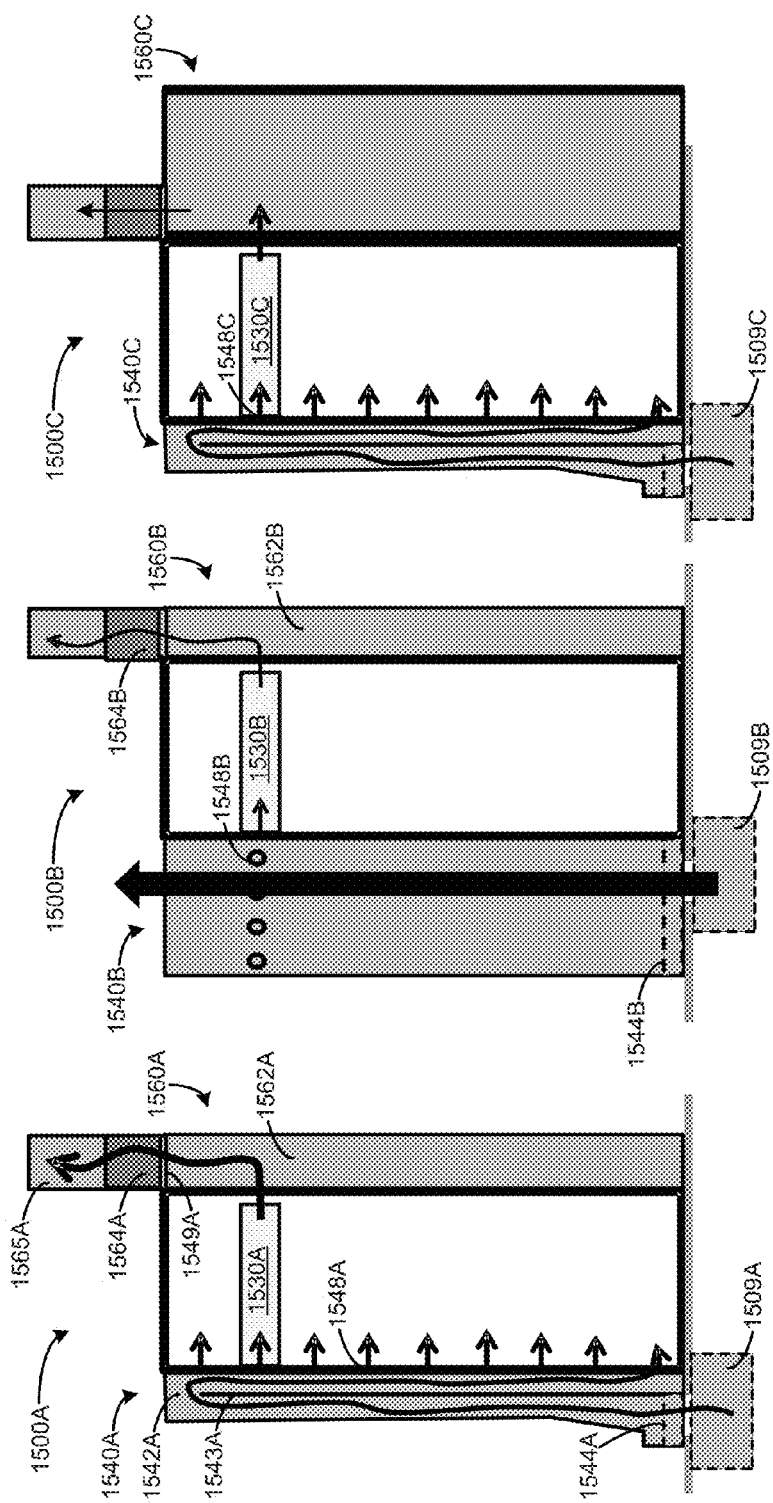

1700

┌─────────────────────────────────────────┐
│ Supply air from a first plenum based on a blind- │ ─ 1710
│ mate supply interface, wherein the first plenum is │
│ to serve as a first structural member of a rack │
│ frame to structurally support a removable module │
└─────────────────────────────────────────┘
                    ↓
┌─────────────────────────────────────────┐
│ Direct the supplied air from the first plenum │ ─ 1720
│ through a door plenum to the removable module, │
│ wherein the door plenum is associated with a │
│ door of the rack frame │
└─────────────────────────────────────────┘
                    ↓
┌─────────────────────────────────────────┐
│ Exhaust air from the removable module to a │ ─ 1730
│ second plenum based on a blind-mate exhaust │
│ interface, wherein the second plenum is to serve │
│ as a second structural member of the rack frame │
│ to structurally support the removable module │
└─────────────────────────────────────────┘
                    ↓
┌─────────────────────────────────────────┐
│ Structurally support the door based on at least │ ─ 1740
│ one of the first plenum and the second plenum │
└─────────────────────────────────────────┘

*FIG. 17*

PLENUMS FOR REMOVABLE MODULES

BACKGROUND

Cooling for computing systems (e.g., a datacenter cooling room) may include multiple stages of cooling equipment, such as a Computer Room Air Conditioner (CRAC), fans in rack systems, and fans in individual equipment modules within the rack systems, and so on. Cooling approaches may inefficiently circulate air throughout entire datacenter rooms, e.g., through cold and hot aisles of the room. Cold aisles, between the racks or raised floor plenums below the racks, may be used to dump cool air towards the front and/or bottom of the entire room. Equipment installed in each rack may pull air from the cold aisle or raised floor, pulling the cold air through the congested rack and rack-mounted equipment. Extracted heat from the equipment is then dumped into the hot aisles, situated between the racks or into the chimney vents above the racks.

BRIEF DESCRIPTION OF THE DRAWINGS/FIGURES

FIG. 11A is a front view block diagram of a system including a door according to an example.

FIG. 11B is a front view block diagram of a system including a door according to an example.

FIG. 11C is a front view block diagram of a system including a door according to an example.

FIG. 13A is a top view block diagram of a system including a door and a fan box according to an example.

FIG. 13B is a top view block diagram of a fan box including a baffle according to an example.

FIG. 13C is a top view block diagram of a system including a door and a fan box according to an example.

FIG. 15A is a side view block diagram of a system including a front door and a rear door according to an example.

FIG. 15B is a side view block diagram of a system including a front door and a rear door according to an example.

FIG. 15C is a side view block diagram of a system including a front door and a rear door according to an example.

FIG. 17 is a flow chart based on supplying air and exhausting air in a system according to an example.

DETAILED DESCRIPTION

Rack cabinets (e.g., rack frame systems) may be used in datacenter computer rooms or datacenters to hold rack-mountable server, storage and network equipment. In blade server rack frame systems, where there are backplanes behind the blade modules and switch modules behind the backplanes, there are significant challenges in delivering cool air, passing through the blade modules, to the switch modules, and exhausting the heated air to the rear of switch module face plates (that may be full of connectors and cables).

In example systems described herein, cool air may be more efficiently delivered directly to, and hot air may be more efficiently extracted directly from, the equipment (e.g., removable modules) in a rack frame system (e.g., a cabinet). Air manifolds (e.g., plenums, interfaces, and so on along a flow path) may be used for air delivery and extraction in the rack frame system and/or removable modules. For example, cooling air may be delivered as a service to the rack frame system, similar to delivery of power or network/fabric services.

In an example, plenums may be used to provide an airflow path to and from a CRAC, to a room plenum, to a row plenum, to a rack plenum, to an in-module plenum, and so on. The various components may use interfaces to connect to and from an air source and/or air sink, connect across rack frames, within a rack frame system, between a rack frame system and its blades (e.g., removable modules), and within each of the removable modules. Thus, example systems and methods may enable lower energy cost and less overall real estate infrastructure for cooling rack frame systems and associated equipment. Furthermore, references to rack frame herein may refer to an assembly of multiple rack frames, or other assembly of components.

Figure 1:
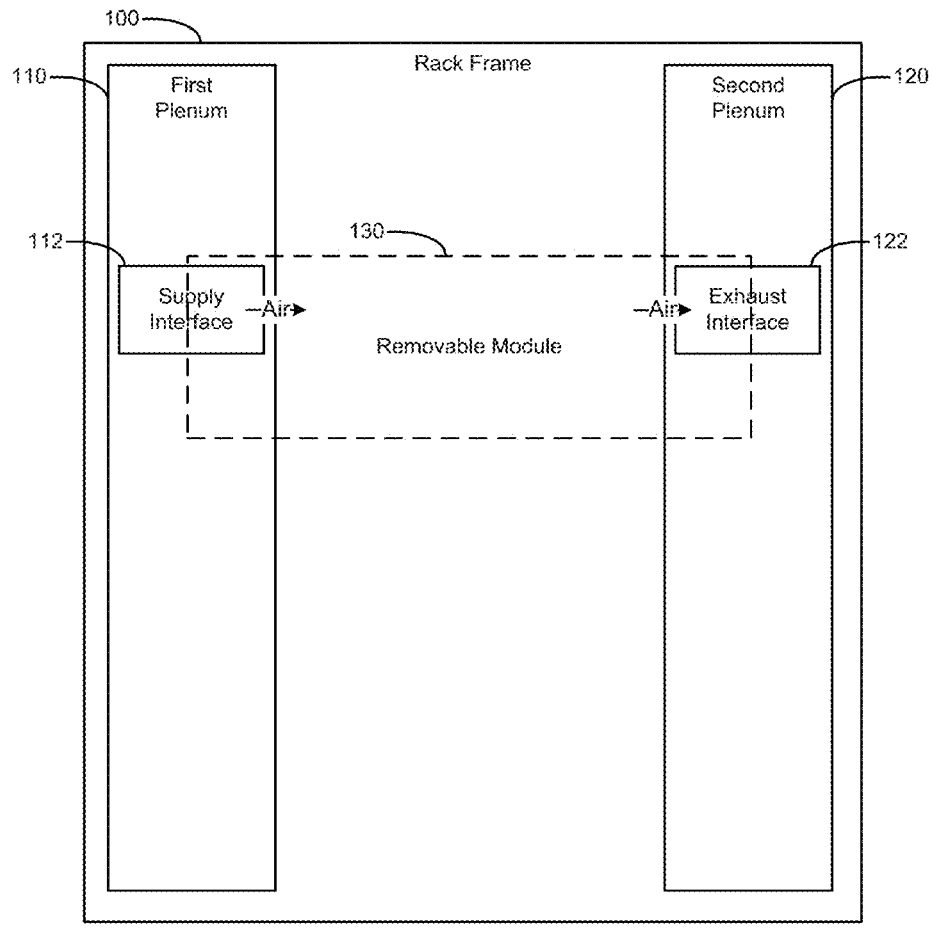
FIG. 1 is a front view block diagram of a system including a first plenum and a second plenum according to an example.

FIG. 1 is a front view block diagram of a system 100 including a first plenum 110 and a second plenum 120 according to an example. System 100 also includes a supply interface 112 and an exhaust interface 122, to interface with a removable module 130.

The first plenum 110 is to serve as a first structural member of the system 100. For example, the first plenum 110 may serve as a support column for a rack frame system 100, including various features to enable the removable module 130 to be slidably supported to interface with the system 100. The first plenum 110 is to supply air based on the supply interface 112. For example, the first plenum 110 may supply air directly to the removable module 130, and/or may supply the air indirectly (e.g., via an intermediate air path, such as a door plenum or other airway between the first plenum 110 and the removable module 130). The second plenum 120, similar to the first plenum 110, is to serve as a second structural member for the system 100. The second plenum 120 is to exhaust air based on the exhaust interface 122.

Thus, the first plenum 110 is to structurally support and supply air for the removable module 130, and the second plenum 120 is to structurally support and exhaust air from the removable module 130. Although not specifically shown in FIG. 1, the system 100 may include additional first plenums and/or second plenums. Furthermore, although the first plenum 110 is shown as being associated with supplying air, and the second plenum 120 associated with exhausting air, the plenums are interchangeable in alternate examples. Thus, the airflow direction could be reversed relative to the plenums, compared to the specifically illustrated example. Although a side-to-side airflow path is shown, alternate examples enable various in-rack air flow directions such as front-to-back and vertical within a rack frame. Furthermore, examples described herein may be used with any gas/fluid, and are not limited to air as specifically illustrated. One removable module 130 is suggested in FIG. 1. In alternate examples, the rack frame system 100 is to receive a plurality of removable modules 130. Each removable module 130 may interface with a supply interface 112 and an exhaust interface 122.

The supply interface 112 and the exhaust interface 122 may interface with the removable module 130 based on a blind-mate interface. For example, the first plenum 110 and the second plenum 120 may slidably receive the removable module 130 (e.g., into a receiving bay of the rack frame system 100). The various blind-mate interfaces may self-align and sealably engage based on the slidable motion of the removable module 130 relative to the system 100. The interfaces may provide an air-tight seal based on appropriate gaskets or other fittings/mechanisms.

The first plenum 110 and the second plenum 120 may be provided as part of the rack frame system 100 structural supports, and/or they may be added to augment the rack structure. By serving as structural members of the system 100, such as serving as the vertical support posts, space is used efficiently in the system 100, and more real estate can be available for datacenter equipment. For example, additional space may be enabled at the rear portion of the rack frame system 100 equipment, where fabric (network) connectivity, power distribution, and other services also may be present, including redundant and modular fabric, power and management infrastructure that can be arranged to be easily serviceable on the rack frame system 100. In addition, example systems 100 such as switch modules also may be provided with ample faceplate areas for external cable connectivity. Rack-level blade infrastructure design may be made less challenging in terms of modularity, redundancy and size when example systems provided herein enable the real estate at the back of the rack to be freed from clutter associated with fans, fabric connectivity, power connectivity and management connectivity.

Example systems 100 may include features along airflow pathways to assist air flow (e.g., blowers, fans, louvers, dividers, dwells). Inclusion of such features may depend on the air temperature, humidity, amount of compressed air pressure provided at the first plenum 110, how many turns and/or resistance are associated with an airflow path, how much airflow rate is needed (e.g., measured in cubic feet per minute (CFM)), how much air is to be exhausted, and so on. Any of these considerations may lead to using additional air movers in the airflow path. Heated air from removable module 130 may be extracted by rack-mounted fans, and a front bezel may include grilles to balance the resulting air pressure in the removable module 130 to be neutral when the fans pull more air than the first plenum 110 (e.g., cool air plenum) delivers.

Depending on the air impedance through the racks and the components installed within the equipment, variation may be associated with the cool air actually passed through heated components within the rack frame system 100 (e.g., through removable module 130). The air delivery path may be designed to address the worst-case device cooling conditions, which may satisfy one device in the air flow path, while over-provisioning the air delivery for other devices. Features such as air movers or other features described above may be used to avoid over-provisioning an airflow path. Plenum and/or component placement (e.g., chips, boards, connectors, cables) and/or orientation (e.g., DIMMs aligned parallel and/or perpendicular to airflow) may be varied in datacenter equipment to accommodate airflow. For example, components may be placed such that hot components (e.g., processors) are not upstream in the airflow path from temperature sensitive components. Temperature, flow rate, humidity, and other sensors may be included throughout the rack frame 100 (e.g., in first plenum 110 and/or second plenum 120, at the supply interface 112 and/or exhaust interface 122, in the removable module 130, and elsewhere). The sensors may enable various data collection and mapping, such as an airway topology and a thermal profile of an entire rack frame system 100 and/or row of systems 100. Also, the sensors may enable detection of air leakage, e.g., based on detecting a deviation from an expected air pressure characteristic and deriving the air leakage condition.

The example in FIG. 1 may be implemented with cold air associated with the first plenum 110, and hot associated with the second plenum 120. In an example system (e.g., using low-power switches as removable modules 130), heated air within the switch modules may passively escape through front bezels of the switch modules, due to positive pressure of the cool air delivered to them by the first plenum 110 in the rack frame system 100.

The example of FIG. 1 shows the first plenum 110 and the second plenum 120 arranged vertically, and the removable module 130 arranged horizontally. In alternate examples, the plenums may be arranged horizontally and the removable module 130 may be vertically oriented.

The first plenum 110 may be positively pressurized, and/or the second plenum 120 may be negatively pressurized. In an example, cold air may be delivered to the front of the rack from the system via a rack supply interface compatible with a room-level cold air delivery method, such as raised floor plenum or ceiling suspended plenums. Thus, the cold air can be blown into the rack and hot air can be sucked out of the track, for a component to be cooled between the first and second plenums to enable airflow through the component. In an example, hot air may be exhausted out to the rear of the rack frame system 100, compatible with a room-level heat extraction method, such as hot aisle or chimney vents via a rack exhaust interface.

The rack frame system 100 may include a plurality of bays to receive removable module 130. Air interface ports (e.g., supply interface 112 and exhaust interface 122) in unused bays may default to a closed configuration. For example, air intake and/or exhaust through these closed ports may be restricted or prevented when no removable module is installed in that row or rack position (bay). Louvers, doors, shutters, valves, or other mechanisms may be used to control air flow during removal or installation of components and/or removable modules 130. Air delivery in a particular removable module 130, such as cool air dwell time, may be managed based on air management devices at the rack frame interfaces described above, as well as being managed based on module components such as bezel grilles and air baffles for the removable module. Air pressure sensors may be placed within each removable module 130. An inlet and exhaust air management controller may be placed in each removable module, which may communicate with a management controller associated with the rack frame system 100 (or row of rack frame systems 100), to regulate the air pressure, as needed. A removable module 130 may include air inlet and exhaust ports, corresponding to the supply interface 112 and the exhaust interface 122 of the rack frame system 100. The air inlet and exhaust ports of the removable module 130 also may have air flow control mechanisms (e.g., air louvers/valves etc.) to regulate the air flow through the removable module 130.

Thus, airflow through datacenter equipment, such as rack frame system 100, may be based on first plenum 110 and/or second plenum 120, independently of rack door perforation, cold/hot aisle efficiencies, and equipment locations in the rack frame system 100 (e.g., top vs. bottom front portion of the rack, where cool air availability from a cold aisle may be inconsistent).

Figure 2:
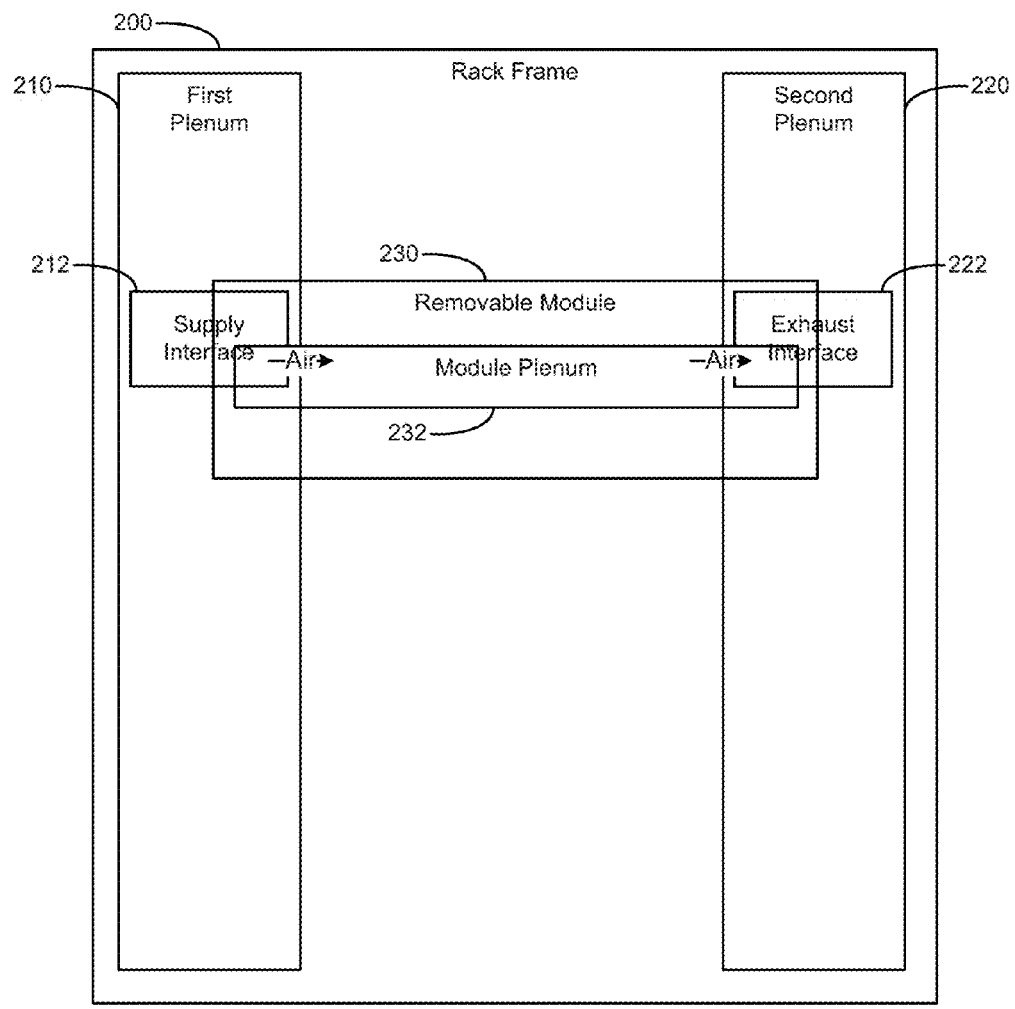
FIG. 2 is a front view block diagram of a system including a first plenum, a second plenum, and a module plenum according to an example.

FIG. 2 is a front view block diagram of a system 200 including a first plenum 210, a second plenum 220, and a module plenum 232 according to an example. System 200 also includes a supply interface 212 and an exhaust interface 222, to interface with the removable module 230. The supply interface 212 and the exhaust interface 222 may interface with the module plenum 232.

The removable module 230 may include a module plenum 232, and may include a plurality of module plenums 232. The module plenum 232 may provide a specific airflow path within the removable module 230. For example, the module plenum 232 may supply airflow to, and exhaust airflow from, a processor that generates heat. Accordingly, heated air, from the component(s) corresponding to the module plenum 232, is directed independently from other components of the removable module 230. The module plenum 232 may be combined with other features, such as baffles or other airflow affecting features. The module plenum 232 may be arranged to receive a portion of the air path as shown, enabling additional airflow through the removable module 230. In alternate examples, the module plenum 232 may receive the entire airflow path from the supply interface 212 and provide the entire airflow path to the exhaust interface 222. The module plenum 232 may be provided as a removable component to the removable module 230 (e.g., provided as a lid to the removable module 230). In alternate examples, the module plenum 232 may be provided as an integral component of the removable module 230 and/or the rack frame system 200.

Figure 3:
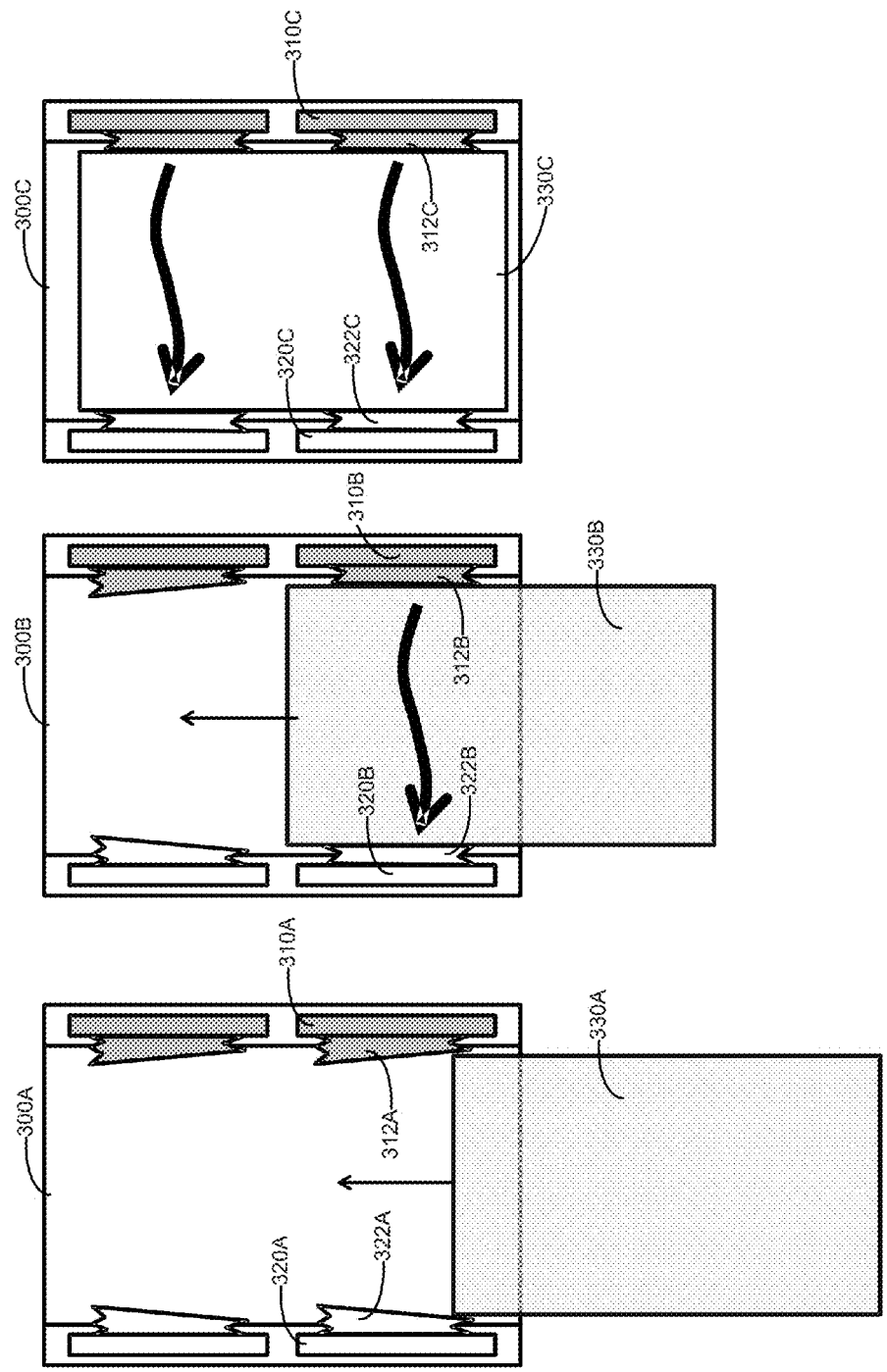
FIG. 3A is a top view block diagram of a system including a first plenum and a second plenum to receive a removable module according to an example.
FIG. 3B is a top view block diagram of a system including a first plenum and a second plenum to receive a removable module according to an example.
FIG. 3C is a top view block diagram of a system including a first plenum and a second plenum to receive a removable module according to an example.

FIG. 3A is a top view block diagram of a system 300A including a first plenum 310A and a second plenum 320A to receive a removable module 330A according to an example. The first plenum 310A includes a supply interface 312A, and the second plenum 320A includes an exhaust interface 322A. The removable module 330A is shown partially inserted into a bay at a front of the system 300A, just before contact with supply interface 312A and exhaust interface 322A. System 300A includes a plurality of first plenums 310A and a plurality of second plenums 320A, including their associated plurality of supply interfaces 312A and plurality of exhaust interfaces 322A. The supply interface 312A and the exhaust interface 322A are based on bellows to couple with corresponding interfaces of the removable module 330A, based on insertion of the removable module 330A into the system 300A. The interfaces may serve as gaskets to minimize air loss from the first plenum 310A and/or the second plenum 320A.

The supply interface 312A and exhaust interface 322A may interface with the removable module 330A based on mechanical, magnetic, friction, or other interlocking and/or coupling techniques. The example of FIG. 3A shows one removable module 330A from a top-down view. However, the system 300A may receive a plurality of removable modules 330A, and the supply interface 312A and exhaust interface 322A may be provided at each receiving bay in the rack frame system 300A to receive a removable module 330A. The supply interface 312A and exhaust interface 322A are shown having an accordion-style bellows shape, slanted to provide a wider opening to receive the removable module 330A. The bellows may be provided based on other arrangements, including rounded or other non-slanted arrangements to receive the removable module 330A.

FIG. 3B is a top view block diagram of a system 300B including a first plenum 310B and a second plenum 320B to receive a removable module 330B according to an example. The removable module 330B is shown inserted half-way into a bay of the system 300B, engaging supply interface 312B and exhaust interface 322B of the first set of plenums. The supply interface 312B and exhaust interface 322B are shown deflected/deformed to accommodate a seal with the perpendicular sides of removable module 330B. However, the supply interface 312B and exhaust interface 322B may be provided to accommodate various non-perpendicular sides of the removable module 330B (e.g., the removable module may have slanted, rounded, or other non-perpendicular sides to interact with non-slanted bellows interfaces). The supply interface 312B and exhaust interface 322B may be based on a non-slanted material that is pre-biased or held into the slanted receiving position, e.g., based on a latch or support to bias the face of the interface and slant it toward receiving the removable module 330B. The supply interface 312B and exhaust interface 322B may provide a retaining function for securing the removable module 330B. The retaining function may provide vibration damping and/or noise isolation for the removable module 330B.

FIG. 3C is a top view block diagram of a system 300C including a first plenum 310C and a second plenum 320C to receive a removable module 330C according to an example. The removable module 330C is shown fully inserted into a bay of the system 300C, engaging supply interfaces 312C and exhaust interfaces 322C of the plurality of first plenums 310C and second plenums 320C.

The removable module 330C may be designed to work with this side-to-side orientation of airflow from the first plenum 310C to the second plenum 320C. Components in the removable module 330C may be laid out to take advantage of this airflow path, e.g., arranging components based on their airflow and temperature characteristics.

Figure 4:
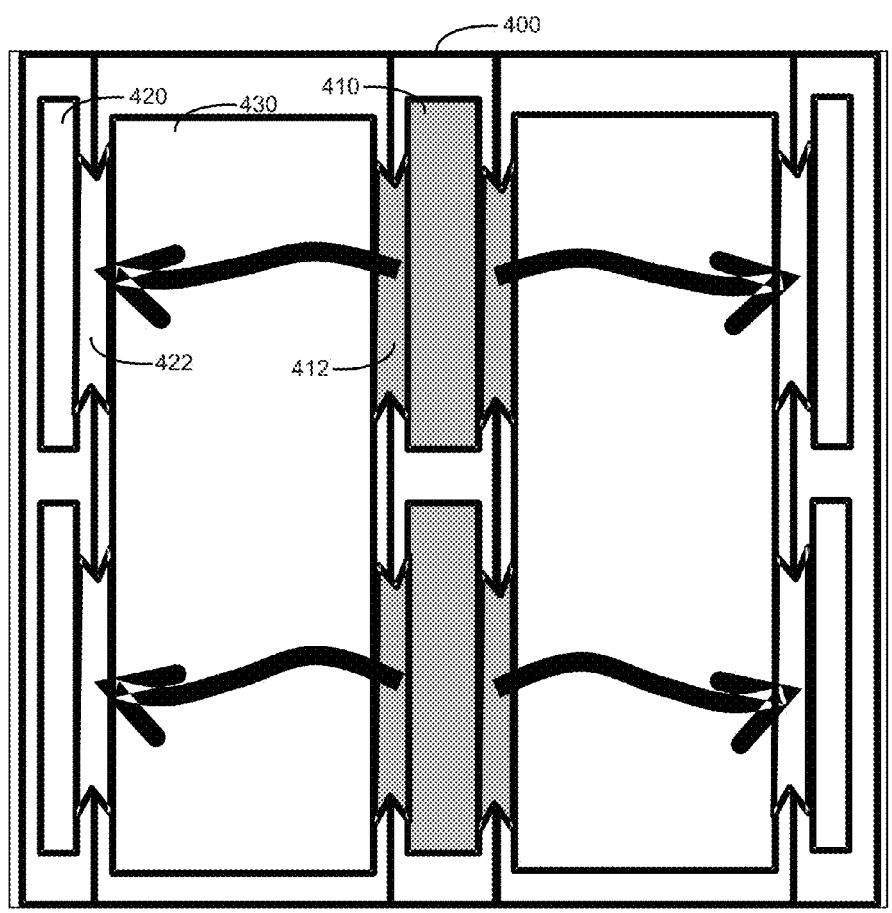
FIG. 4 is a top view block diagram of a system including a first plenum and a second plenum to receive a removable module according to an example.

FIG. 4 is a top view block diagram of a system 400 including a first plenum 410 and a second plenum 420 to receive a removable module 430 according to an example. The first plenum 410 includes a supply interface 412, and the second plenum 420 includes an exhaust interface 422. The system includes a plurality of first plenums 410 and second plenums 420. The first plenums 410 are positioned to divide a width of at least a portion of the system 400 to provide a plurality of half-width bays to accommodate a plurality of airflow paths to the plurality of half-width bays and/or half-width removable modules 430. Although the airflow paths are shown flowing outward, the position of the first plenum 410 and second plenum 420 may be interchanged, such that the airflow paths may flow inward.

The rack frame system 400 may be a wide rack to share the centrally arranged first plenum 410 and associated supply interfaces 412, while still maintaining standard half-width bays. No fans or other airflow components are shown at a top of FIG. 4, corresponding to a back of the rack frame system 400. Thus, real-estate is available behind the removable modules 430, such that a rear of the removable modules 430 and/or rack frame system 400 may be used for power, fabric, and other connectivity. A front of the removable modules 430 may be populated with other components, such as value-added hot-plug devices. Intake and exhaust air ports (e.g., supply interfaces 412 and exhaust interfaces 422) may be large, and components (e.g., processor and/or memory complexes) may get an ample supply of cold air and easily exhausted hot air. Thus, the arrangement of a shared center first plenum 410 may save overall floor space and provide additional rack footprint options.

Figure 5:
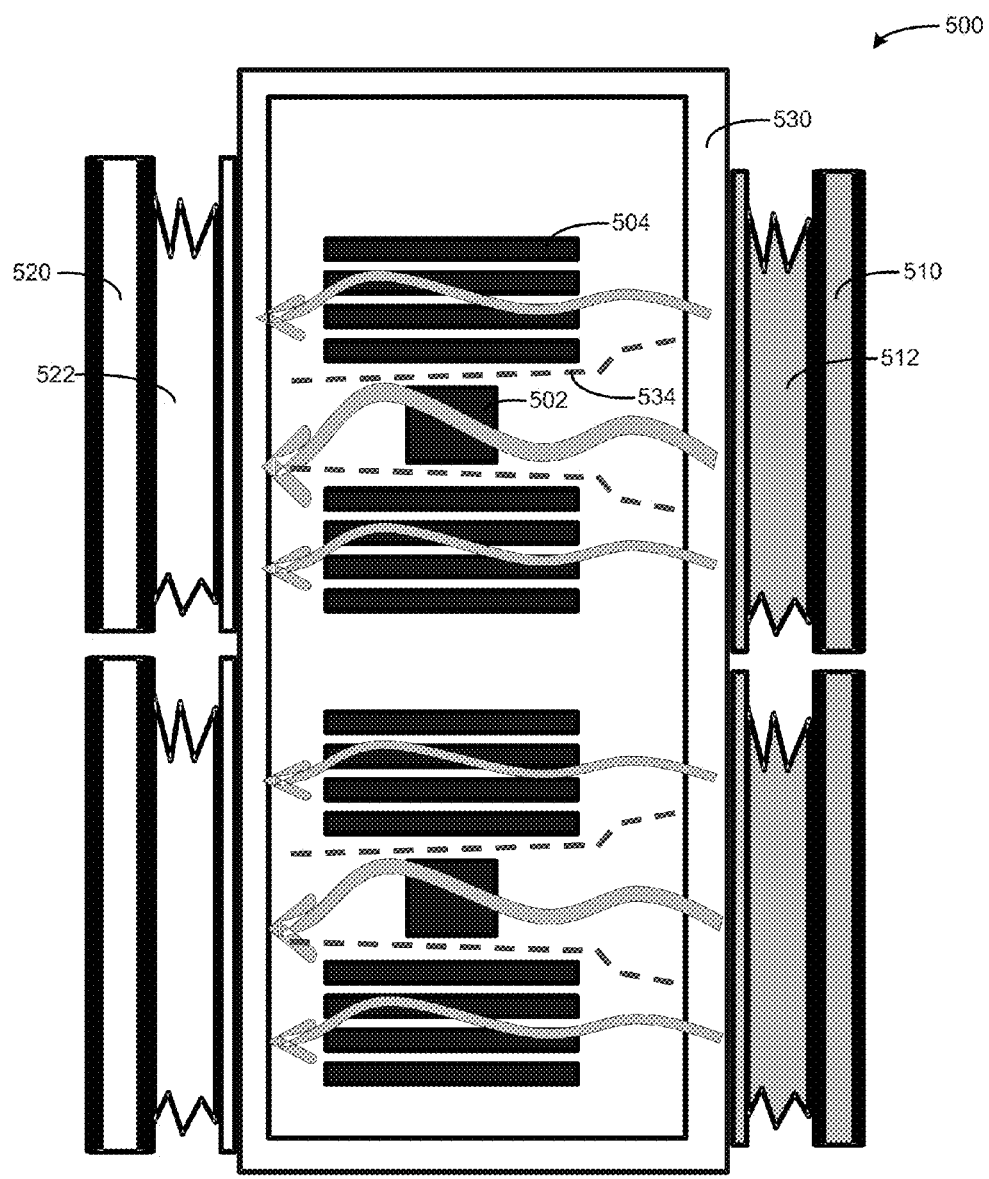
FIG. 5 is a top view block diagram of a system including a removable module and a module baffle according to an example.

FIG. 5 is a top view block diagram of a system 500 including a removable module 530 and a module baffle 534 according to an example. The removable module 530 is to interface with a first plenum 510 based on a supply interface 512. The removable module 530 is to interface with a second plenum 520 based on an exhaust interface 522. The removable module 530 may include a processor 502 and memory 504, and may include additional components not specifically shown in FIG. 5. The module baffle 534 may affect a module air route in the removable module 530.

The processor 502 may produce relatively more heat compared to the memory 504. Accordingly, the module baffle 534 may be arranged to direct a relatively larger amount of the airflow toward the processor 502. This is represented by a relatively larger arrow to represent airflow associated with processor 502 compared to the arrows to represent airflow associated with the memory 504. Furthermore, the baffle 534 may provide isolation for various airflow pathways in the removable module 530. The baffle 534 may alter other characteristics of the airflow path, such as velocity and pressure, due to interactions between the airflow and the module baffle 534. Accordingly, heat from the processor 502 may be isolated from the memory 504, for example.

The module baffle 534 may be removable. For example, the module baffle 534 may be an insert that can be customized for various applications (e.g., providing a removable module baffle for a single-processor motherboard as shown, and providing another removable module baffle that is suitable for a dual-processor motherboard associated with a plurality of airflow paths). Alternatively, the module baffle 534 may be integrated with the housing for the removable module 530. Thus, when swapping out different motherboards/component layouts for the removable module 530, a different housing and module baffle may be used. The module baffle 534 may be combined with a module plenum to provide additional flexibility, e.g., airflow within a module plenum may be further divided and/or affected by a module baffle.

Figure 6:
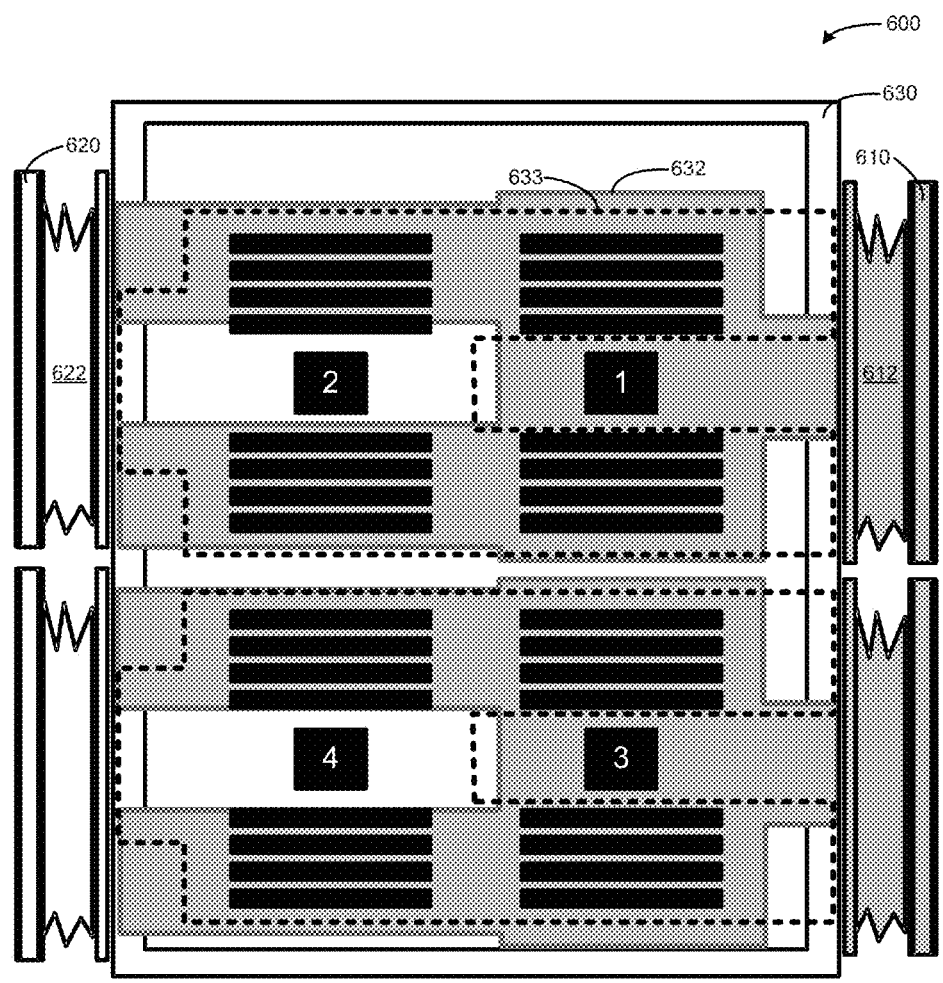
FIG. 6 is a top view block diagram of a system including a removable module, a first module plenum, and a second module plenum according to an example.

FIG. 6 is a top view block diagram of a system 600 including a removable module 630, a first module plenum 632, and a second module plenum 633 according to an example. System 600 includes a first plenum 610 and supply interface 612, and a second plenum 620 and exhaust interface 622.

The first module plenum 632 and second module plenum 633 are shown stacked on top of each other to provide airflow isolation and customization to a plurality of module components. For example, the first module plenum 632 may be a lower layer air manifold to provide cold air to, and extract hot air from, processor/memory complex 1 (and 3). The second module plenum 633 may be an upper layer air manifold to provide cold air to, and extract hot air from, processor/memory complex 2 (and 4). As shown, air may flow from right to left. Thus, fresh cold air may be provided for each complex, by isolating air from the other complex.

The benefits may be provided based on a plurality of module baffles, and/or a combination of baffles and plenums in the removable module 630. Some form of baffles may be provided within at least one of the first module plenum 632 and/or the second module plenum 633 (e.g., baffles to focus relatively more airflow to the processor compared to the memory). Baffles may be used, for example, to accommodate a heatsink that would typically provide resistance for airflow. The module plenums (and/or module baffles) may be integrated as part of the enclosure/body of the removable module 630. The module plenums may be part of a removable module lid to be installed onto the removable module 630. The module plenums/baffles may be separate parts that are separately insertable into the removable plenum 630.

Thus, multiple module plenums in the removable module 630 enable multiple separate air cavities/containments, that each carries the air in and exit the air out. Example systems thus demonstrate how the air within a removable module 630 may be contained to allow cold air in, and hot air out, independent among different components or groups of components.

Figure 7:
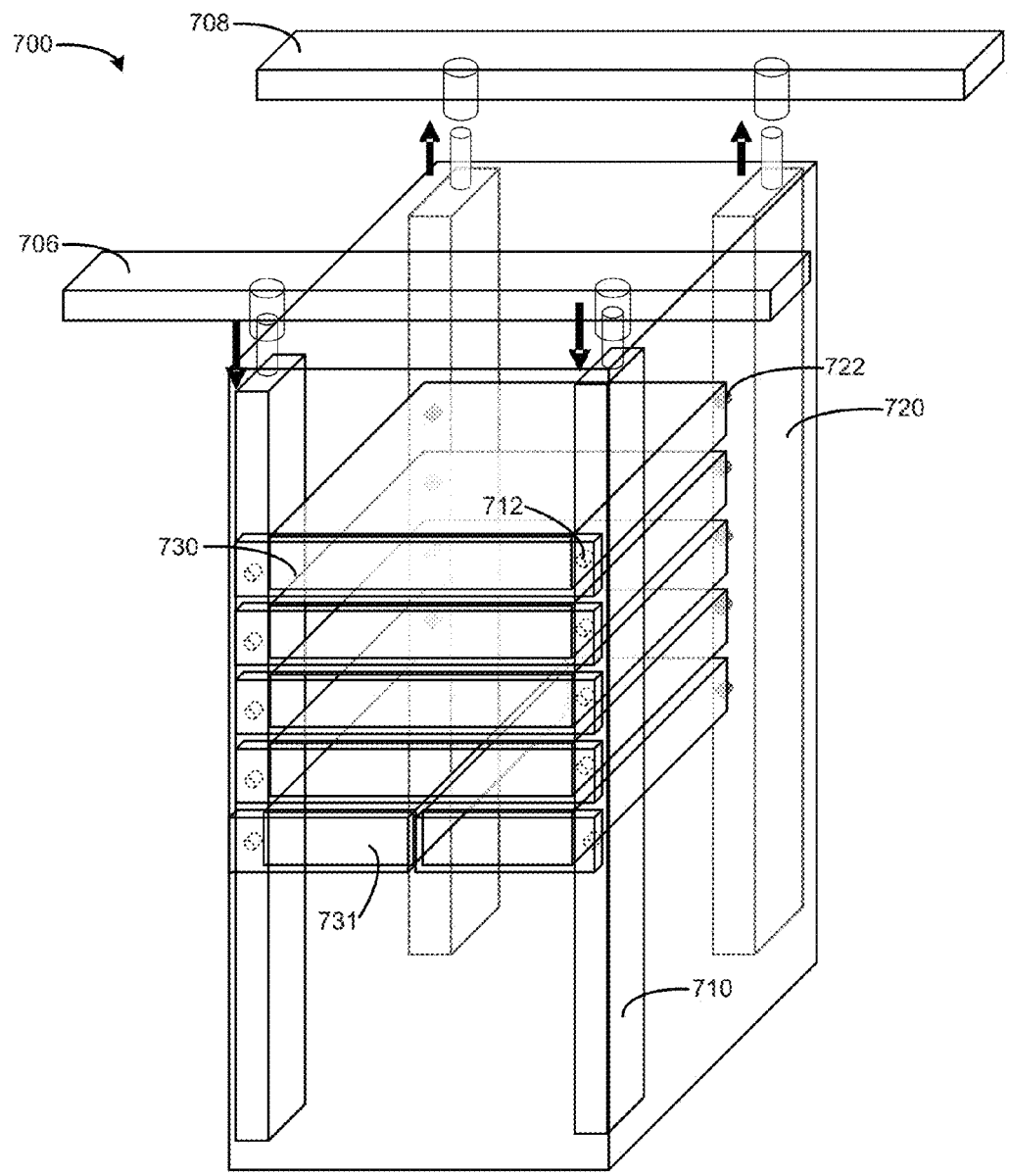
FIG. 7 is a perspective view block diagram of a system including a first plenum, a second plenum, and a plurality of removable modules according to an example.

FIG. 7 is a perspective view block diagram of a system 700 including a plurality of first plenums 710, a plurality of second plenums 720, and a plurality of removable modules 730 according to an example. System 700 also includes a plurality of half-width removable modules 731. System 700 may receive cool air from a row supply plenum 706, and exhaust air to a row exhaust plenum 708. A removable module 730 may interface with the first plenum 710 based on a supply interface 712. The removable module 730 may interface with the second plenum 720 based on an exhaust interface 722.

The first plenums 710 may contain positive pressure cool air encased within front corner posts of the system 700. The second plenums 720 may contain negative pressure hot air encased within rear corner posts of the system 700. The first plenums 710 and the second plenums 720 include air feed and exhaust ports above the system 700 to interface with the row supply plenum 706 and row exhaust plenum 708, respectively. When a removable module 730, 731 is installed in system 700, the supply interfaces 712 toward the front of the system 700 interface with corresponding ports on the removable modules. Similarly, the exhaust interfaces 722 toward the rear of the system 700 are to interface with the removable module's corresponding hot air exhaust ports. The system 700 and/or the removable module 730 may use blind-mate interfaces and/or gaskets.

The top four full-width removable modules 730 include cool and hot interfaces on both sides of the removable module to connect to the first plenums 710 and the second plenums 720. The lowest two half-width removable modules 731 are installed side-by-side, where each half-width removable module 731 connects to a first plenum 710 and a corresponding second plenum 720 on one side of the system 700. Accordingly, the side-by-side half-width removable modules 731 are oriented 180-degrees relative to each other. The same half-width module design may be flipped 180-degrees, and associated air interfaces will be aligned between the half-width removable module 731 and corresponding interfaces of the first plenum 710 and the second plenum 720. The system 700 may include additional air intake and exhaust ports on the first plenums 710 and the second plenums 720, e.g., to accommodate additional removable modules 730, 731. The unoccupied ports may normally be closed when no equipment is installed in the bay corresponding to those ports.

In the example shown in FIG. 7, cool air is supplied to, and hot air is removed from, the system 700 via the row supply plenum 706 and the row exhaust plenum 708. Thus, generation and/or heat exchangers may be housed externally, to deliver and extract air remotely. In alternate examples, cool air generation and/or heat exchangers also may be housed locally within a rack frame system 700 and/or in adjacent rack frame systems (not shown). A cooling system may be integrated within the rack frame system 700, to provide another method to feed cool air to, and extract hot air from, the system 700 (e.g., based on an internally redundant cooling system at the base of system 700 to draw hot air in from the second plenums 720 and provide cool air to the first plenums 710). Air boxes with air movers may be attached to rack doors or the rack frame, placed under a raised floor, in addition to or as an alternative to the attached and/or suspended plenums above the system 700 as shown. Per-rack hot air plenum(s) may be located in the rack/system 700, located right above the rack, suspended in a ceiling, or in the ceiling attic. Per-rack cold air plenum (s) may be in the rack/system 700, or below the rack (e.g., in the raised floor) to collect air from a CRAC. Air movers may be placed in system 700, such as in various plenums. A rack-integrated cooling system may be placed at the bottom of the system 700 to pull cool air from a front cold aisle, and the cooling system may use an air scoop. Alternatively, cool air may be pulled in from raised floor plenums immediately at the bottom of the system 700, where an appropriate air plenum interface (not shown), instead of the air scoop described above, may be used.

The various example rack frame systems 700 may use a first type (e.g., larger capacity) air interface port to interface with the air source and sink (e.g., row supply, exhaust plenums 706, 708). However, the rack frame systems 700 may use a different (e.g., standardized) type of air interface port to accommodate the removable modules. Thus, removable modules 730, 731 may be interchangeable among different example rack frame systems 700, based on using the type of air interface ports shared among the different rack systems and modules, regardless of how a particular rack frame system 700 interfaces with its own air supply (e.g., row supply, exhaust plenums 706, 708).

Thus, additional space is available for accommodating a fabric (e.g., optical) plenum and/or a power plenum on the back side of the rack system 700, because there are no fans that would be typically needed, enabled by the rack-integrated plenums to manage the air flows through the system 700 and removable modules 730, 731.

Figure 8:
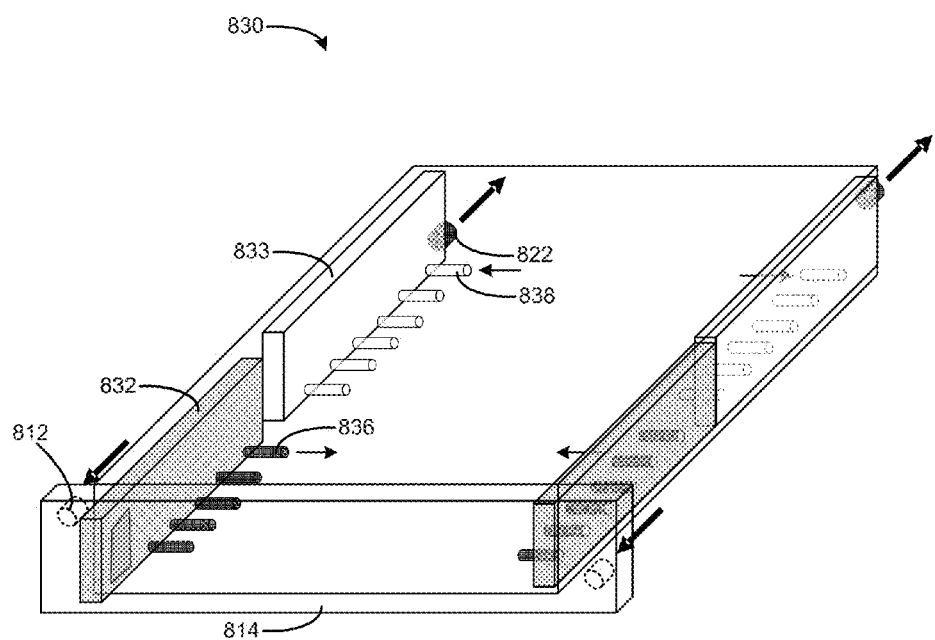
FIG. 8 is a perspective view block diagram of a removable module including a first module plenum and a second module plenum according to an example.

FIG. 8 is a perspective view block diagram of a removable module 830 including a first module plenum 832 and a second module plenum 833 according to an example. The first module plenum 832 may receive air based on supply interface 812, and provide air to the removable module 830 based on module supply outlet 836. The second module plenum 833 may receive air from the removable module 830 based on module exhaust inlet 838, and exhaust air based on exhaust interface 822.

The removable module 830 may be a full-width blade, having integrated cold and hot first and second module plenums 832, 833, respectively. Module supply outlets 836 and module exhaust inlets 838 are positioned on both sides of the removable module 830, to cool the devices within the removable module 830 (e.g., provide a plurality of airflow paths within the removable module 830). Cool air may enter from both sides of the removable module 830 via a front air manifold 814 coupled to first module plenums 832. Similarly, the hot air escapes towards the rear on both sides of the removable module 830 via second module plenums 833 and exhaust interfaces 822.

In practice, the front air manifold 814 may have a different configuration/shape than that shown, e.g., to allow front pluggable devices. However, a traditional air grille is not needed in the front air manifold 814, because air circulation does not need to pass through the front bezel of the removable module 830. Air baffles or other air distribution features may be used within the removable module 830 to appropriately route the cold and hot air across multiple electronic components (not shown).

Figure 9A:
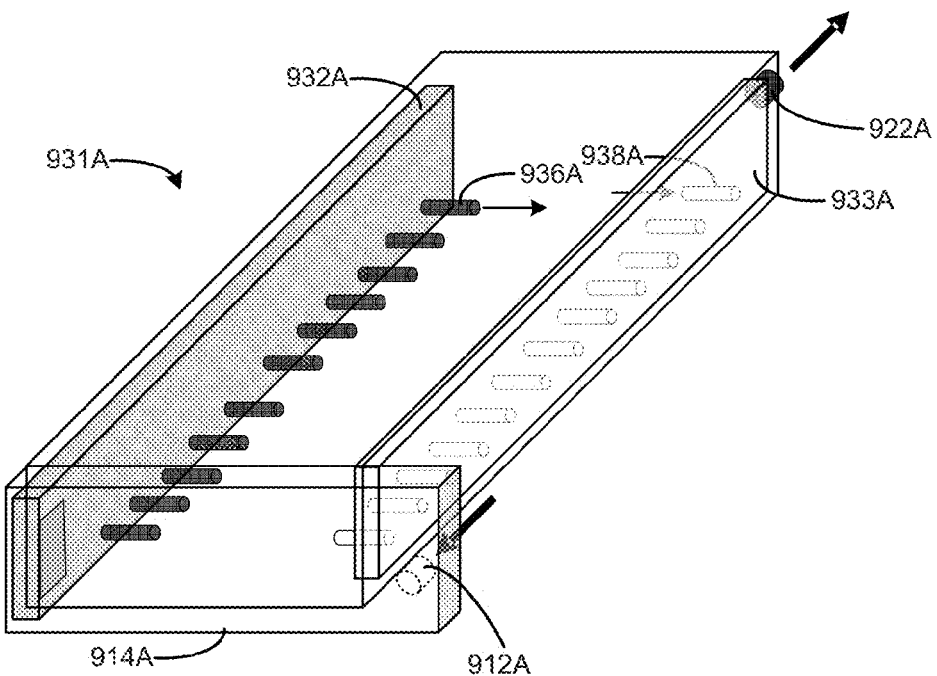
FIG. 9A is a perspective view block diagram of a removable module including a first module plenum and a second module plenum according to an example.

FIG. 9A is a perspective view block diagram of a removable module 931A including a first module plenum 932A and a second module plenum 933A according to an example. The first module plenum 932A may receive air based on supply interface 912A and front air manifold 914A, and provide air to the removable module 931A based on module supply outlet 936A. The second module plenum 933A may receive air from the removable module 931A based on module exhaust inlet 938A, and exhaust air based on exhaust interface 922A.

The removable module 931A may be a half-width blade having integrated first and second module plenums 932A, 933A, and supply interface 912A and exhaust interface 922A on one side of the blade to cool the devices within the blade (not shown). The cool air enters from one side of the blade front air manifold 914A and is routed to the first module plenum 932A along the depth of the blade. The first module plenum 932A may include an internal baffle to affect airflow (e.g., provide constant velocity at the plurality of module supply outlets 936A). The hot air escapes towards the rear from the exhaust interface 922A, on the same side of the blade as the supply interface, to interface with a rack's second plenum 920A, for example.

Figure 9B:
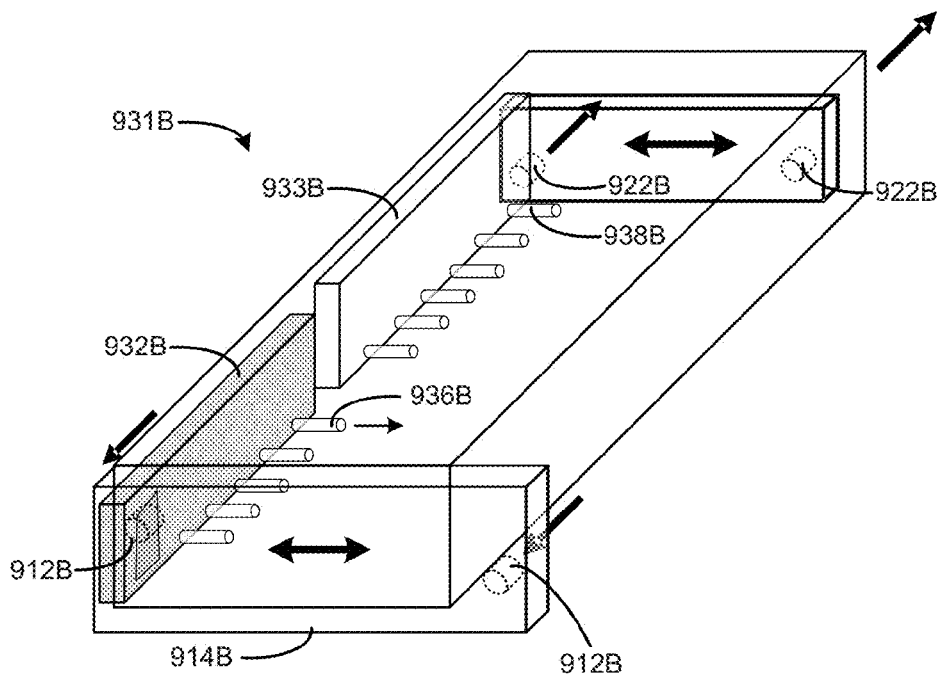
FIG. 9B is a perspective view block diagram of a removable module including a first module plenum and a second module plenum according to an example.

FIG. 9B is a perspective view block diagram of a removable module 931B including a first module plenum 932B and a second module plenum 933B according to an example. The first module plenum 932B may receive air based on supply interface 912B and front air manifold 914B, and provide air to the removable module 931B based on module supply outlet 936B. The second module plenum 933B may receive air from the removable module 931B based on module exhaust inlet 938B, and exhaust air based on exhaust interface 922B. One first module plenum 932B and one second module plenum 933B are shown, although another set may be used on the opposing side of the removable module 931B.

The front air manifold 914B may be slidable side-to-side with respect to the removable module 931B, as shown by the double-headed arrow. Furthermore, the supply interface 912B may telescope into and out of the front air manifold 914B, to selectively extend to engage a supply plenum of a rack frame, or selectively be withdrawn into the front air manifold 914B. Accordingly, the cool air may enter from either side of the blade front air manifold 914B, to be routed to the first module plenum 932B. Similarly, the rear of the removable module 931B may include a slidable rear air manifold with retractable/extendable exhaust interfaces 922B, with corresponding functionality to exhaust air from the second module plenum 933B. Thus, the removable module 931B may be used on either side of a rack frame without needing to flip the removable module 931B 180 degrees.

Figure 10A:
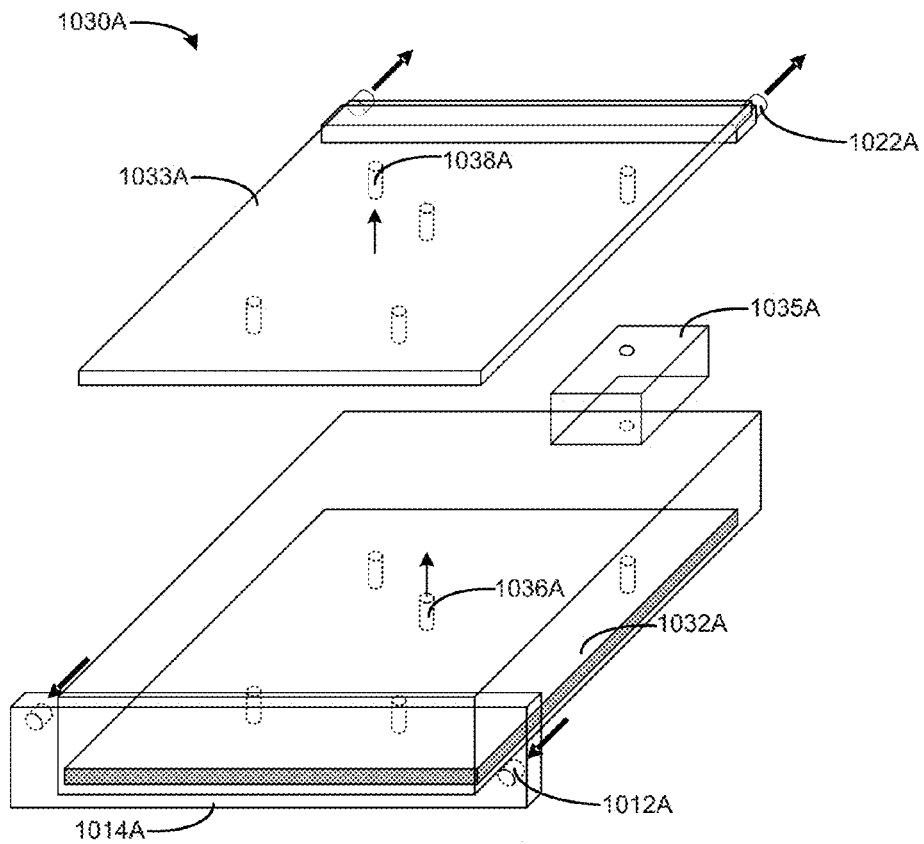
FIG. 10A is an exploded perspective view of a block diagram of a removable module including a first module plenum and a second module plenum according to an example.

FIG. 10A is an exploded perspective view of a block diagram of a removable module 1030A including a first module plenum 1032A and a second module plenum 1033A according to an example. The first module plenum 1032A may receive air based on supply interface 1012A, and provide air to the removable module 1030A based on module supply outlet 1036A. The second module plenum 1033A may receive air from the removable module 1030A based on module exhaust inlet 1038A, and exhaust air based on exhaust interface 1022A. The second module plenum 1033A (e.g., a hot air manifold) is shown lifted for clarity.

The second module plenum 1033A may be a removable plenum, also serving as the module lid, which may be on a top side of the removable module 1030A. The exhaust interface 1022A may be a blind-mate lid interface to couple to at least one of a blind-mate supply interface and a blind-mate exhaust interface of a rack frame system having corresponding first and second plenums.

The removable module 1030A may include supply interfaces 1012A and front air manifold 1014A similar to the blades of earlier examples. However, the first module plenum 1032A within the removable module 1030A is at the bottom side of the removable module 1030A, e.g., below a motherboard and having air escape routes (module supply outlets 1036A) through holes on a motherboard to be installed in the removable module 1030A. Thus, the motherboard may be mounted on top of (e.g., in contact with) the first module plenum 1032A. The motherboard may be customized to accommodate the module supply outlets 1036A or other features of the removable module 1030A. Components to be installed may be inside a component plenum 1035A having holes or other modifications and/or customizations for air flow and/or additional module plenums and/or module baffles. The component plenum 1035A may include interfaces to interface with the module supply outlet 1036A and module exhaust inlet 1038A, providing isolation for corresponding airflow within the component plenum 1035A. Such features may be removable and/or integrated as part of the housing for the removable module 1030A. In an example, the second module plenum 1033A (e.g., the removable lid) may be integrated with baffles and/or plenums or other features to affect airflow. Thus, such features may be changed by swapping out the lid (second module plenum 1033A). The features of the removable lid (e.g., module exhaust inlets 1038A, baffles, plenums) may be interfaced to each component (not shown) in the removable module 1030A, or a set of components (e.g., processor/memory complex). Different blade shells (e.g., the enclosure for the removable module 1030A) may enable different cooling environments for the same motherboard, based on different combinations of module supply outlets 1036A, module exhaust inlets 1038A, baffles, and/or plenums associated with a blade shell that the motherboard is installed in. In alternate examples, the features may be removable and/or separate from the lid and/or other aspects of the blade shell.

Figure 10B:
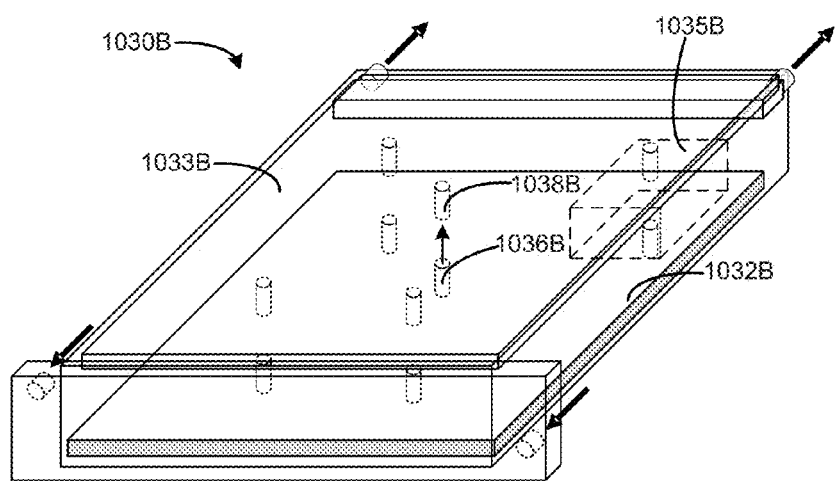
FIG. 10B is a perspective view block diagram of a removable module including a first module plenum and a second module plenum according to an example.

FIG. 10B is a perspective view block diagram of a removable module 1030B including a first module plenum 1032B and a second module plenum 1033B according to an example. The first module plenum 1032B and the second module plenum 1033B are coupled together to enable module supply outlet 1036B to interact with module exhaust inlet 1038B. The module supply outlets 1036B may be aligned with and/or offset from the module exhaust inlets 1038B. A component plenum 1035B is shown providing additional airflow isolation. Thus, a dedicated airflow path may be provided for each component or for each group of components, e.g., corresponding to a component in the removable module 1030B. With the second module plenum 1033B (e.g., the lid) in place, the removable module 1030B is ready for insertion into a rack frame system and may include blind-mate interfaces.

FIG. 11A is a front view block diagram of a system 1100A including a door 1140A according to an example. The door 1140A is a segmented saloon door having a width corresponding to approximately a half-width removable module and/or bay of a rack frame system. A height of the door 1140A may correspond to a full rack height.

Rack doors 1140A may be sized to fit a standard rack frame system 1100A. The doors 1140A may encase air distribution within the system 1100A, and left and right halves may be used to cool half-width and full-width blades (or rack-mount servers). Although not specifically shown, alternate examples may use a full width door. Door height may vary, e.g., customized for various applications.

FIG. 11B is a front view block diagram of a system 1100B including a door 1140B according to an example. A height of the door 1140B may correspond to a half-rack height.

FIG. 11C is a front view block diagram of a system 1100C including a door 1140C according to an example. A height of the door 1140C may correspond to a height of a removable module and/or bay.

Figure 12C:
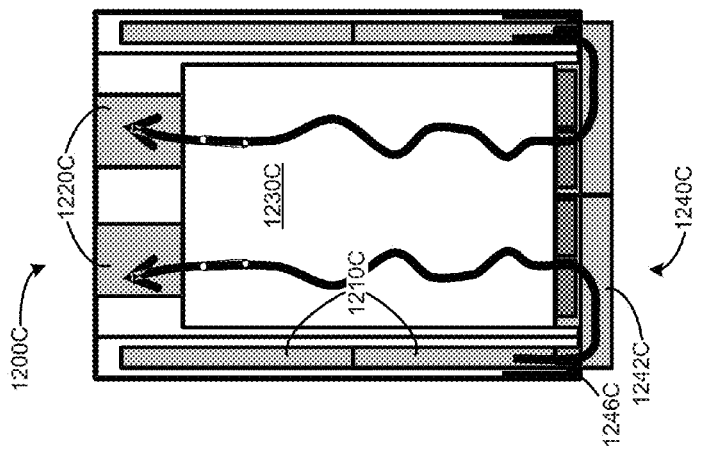
FIG. 12C is a top view block diagram of a system including a door according to an example.
Figure 12B:
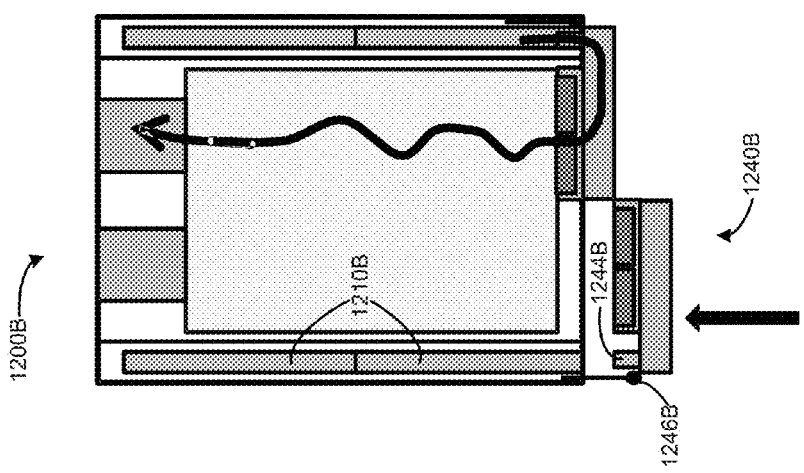
FIG. 12B is a top view block diagram of a system including a door according to an example.
Figure 12A:
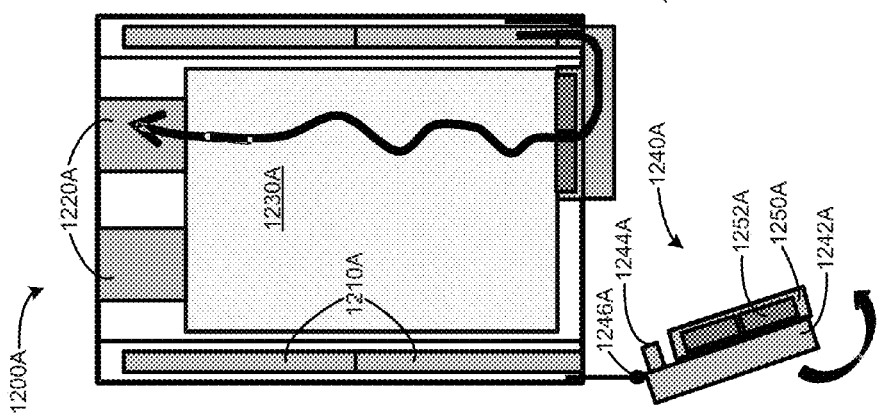
FIG. 12A is a top view block diagram of a system including a door according to an example.

FIG. 12A is a top view block diagram of a system 1200A including a door 1240A according to an example. The system 1200A also includes a first plenum 1210A and a second plenum 1220A to receive a removable module 1230A. The door 1240A includes a door plenum 1242A, door supply interface 1244A, door hinge 1246A, and fan box 1250A. The fan box 1250A includes a fan 1252A.

The rack frame system 1200A is to structurally support the door 1240A including the door plenum 1242A to receive air. The door plenum 1242A may, in turn, supply the received air to the removable module 1230A.

The door 1240A is hingedly supported based on a door hinge 1246A having a pivot axis. The door hinge 1246A is extendably mounted, to enable the door 1240A and pivot axis of the door hinge 1246A to be extended away from the rack frame system 1200A. The saloon door 1240A is shown disengaged and swung out for accessibility to the removable module 1230A. The door 1240A, such as door plenum 1242A, may include air controls such as shutters that may be closed when the door 1240A is extended and/or pivoted open. The right door is shown closed, such that air flow passes through the door plenum 1242A of the right door.

The removable module 1230A may be designed to be used for standard forced air cooling in cold/hot aisles or in closed-loop engineered racks. The system 1200A may sense a status of engagement of the door plenum 1242A. Status information may be used to affect airflow, including closing shutters or other air control features to reduce wasted airflow.

Although the door 1240A is removable, it also may be part of the rack, and it may include air delivery mechanisms (e.g., fans 1252A and fan box 1250A) that can be removably coupled do the door 1240A. The door 1240A and various components can be modularized/customized to different heights (e.g., 1U rack height, 2U rack height, for individual removable modules 1230A). In alternate examples, the fan 1252A and/or fan box 1250A may be omitted, to rely on airflow from the first plenums 1210A (e.g., positive pressure) and/or the second plenums 1220A (e.g., negative pressure). The door 1240A may include mechanisms to enable the door to swing closed and slid into and snapped onto the front of the system 1200A.

FIG. 12B is a top view block diagram of a system 1200B including a door 1240B according to an example. The door 1240B is shown pivoted into a position for insertion into the rack frame system 1200B, with the door hinge 1246B extended away from the rack frame system 1200B. A door supply interface 1244B is aligned to interface with the first plenum 1210B. Shutters or other airflow controls on the door 1240B may still be closed in this position.

FIG. 12C is a top view block diagram of a system 1200C including a door 1240C according to an example. The Door hinge 1246 is retracted into the rack frame system 1200C, fully engaging the door 1240C with the system 1200C such that an airflow path is established from the first plenum 1210C, through the door plenum 1242C, through the removable module 1230C, through the second plenum 1220C.

Thus, both saloon door 1240C and door plenums 1242C are fully engaged. Shutters on the saloon doors are open to enable the cold air to be routed from the first plenums 1210C into the door plenums 1242C, and into the removable module 1230C. The rear rack level "chimney" plenums (second plenums 1220C) may extract hot air from the removable module 1230C, to be exhausted to, e.g., row hot plenums (not shown).

A door 1240C may encase an entire half of the system 1200C, so the system 1200C may be used with a traditional full-width door or half-width saloon doors. The saloon door may be supported by the frame and or the first plenum 1210C (e.g., based on door hinges 1246C). The door 1240C receives the air from the side of the system 1200C via first plenums 1210C, and so either type of door is compatible with receiving cooling air. The air movement can be from the door plenum being affected by air pressure of the first/second plenums 1210C, 1220C, and/or the fans. The door cavity may have a wall/baffle.

FIG. 13A is a top view block diagram of a system 1300A including a door 1340A and a fan box 1350A according to an example. The door hinge 1346A is extended from the system 1300A and the door 1340A is pivoted away from the system 1300A. An air path may include first plenum 1310A, the fan box 1350A, the removable module 1330A, and the second plenum 1320A. However, even with the door 1340A extended and pivoted into an open position, airflow is maintained in the removable module 1330A, based at least in part on the fan box 1350A and/or the second plenum 1320A.

The fan box 1350A may be installed at a front of the removable module 1330A. The fan box 1350A may be mounted to the frame 1300A and/or to the removable module 1330A. The fan box 1350A may be powered by the rack frame system 1300A and/or the removable module 1330A. The fan box 1350A is to pressurize and/or augment airflow to the removable module 1330A. Swinging out the door 1340A, away from the removable module, enables the fan box 1350A to remain servicing the removable module 1330A, to provide airflow. However, "cold" air may be pulled in from the front of the removable module 1330A and system 1300A, instead of directly from the cold first plenum 1310A as when the door 1340A is closed. Alternatively, a fan box 1350A may be simply plugged in directly to a removable module 1330A, and not need the mechanisms associated with door hinge 1346A. However, the door hinge 1346A provides a benefit of having the option to mount the fan box 1350A or otherwise enable the fan box 1350A to be swung out of the way to service the removable module 1330A.

FIG. 13B is a top view block diagram of a fan box 1350B including a fan box air baffle 1356B according to an example. The fan box air baffle 1356B is to direct airflow, e.g., from a door plenum and/or fan 1352B, to a removable module.

For example, the fan box air baffle 1356B may direct airflow toward a component of the removable module, such as a processor. Thus, cold air may be directed in the fan box to create, e.g., higher air flow and/or pressure through the processors located in the middle area of the blade.

FIG. 13C is a top view block diagram of a system 1300C including a door 1340C and a fan box 1350C according to an example. The fan box 1350C is coupleable to the rack frame system 1300C based on a fan box hinge 1354C, to enable servicing of removable module 1330C. For example, pivotable and extendable door 1340C and fan box 1350C may enable removal of a component 1370C from the removable module 1330C, without a need to remove the removable module 1330C from the rack frame system 1300C.

The rack frame 1300C is to structurally support the fan box 1350C, e.g., to provide airflow from the door plenum 1342C to the removable module 1330C based on the fan box hinge 1354C including a fan box pivot axis. Thus, the fan box hinge 1354C is extendably mounted to enable the fan box 1350C and fan box pivot axis to be extended away from the rack frame system 1300C. Notably, the hinges described herein enable components, such as the door 1340C and fan box 1350C, to be arranged for service, without a need to completely disconnect the components from the rack frame system 1300C. Furthermore, airflow is maintained even when the door 1340C and fan box 1350C are open, as indicated by the arrows corresponding to airflow paths (the thinner arrow denoting a reduced airflow path relative to the thicker arrow corresponding to an airflow path augmented by a fan box) leading to the second plenum 1320C. The fan box 1350C may be mounted to the rack frame system 1300C and/or to the removable module 1330C.

Partial air flow is shown on one half of the removable module 1330C that does not have the fan box 1350C installed. The saloon door plenum 1342C and fan box 1350C may be swung open to remove serviceable components 1370C (e.g., disk drives). System 1300C provides independent movement of the door 1340C and the fan box 1350C relative to the rack frame system 1300C and the removable module 1330C. When the system 1300C is being serviced, items may remain attached without a need to remove them. Instead of removing and setting-aside the fan box 1350C for service, it is possible to swing out and pull out the fan box 1350C so that it will clear a way for the component 1370C and/or the removable module 1330C to be removed. The rack door 1340C shares similar functionality, such that the door 1340C may be pulled out, then swing open. Thus, the door 1340C and associated features may remain connected to the system 1300C in this manner, while remaining extended and open for accessing and servicing/replacing parts of the system 1300C.

Figure 14B:
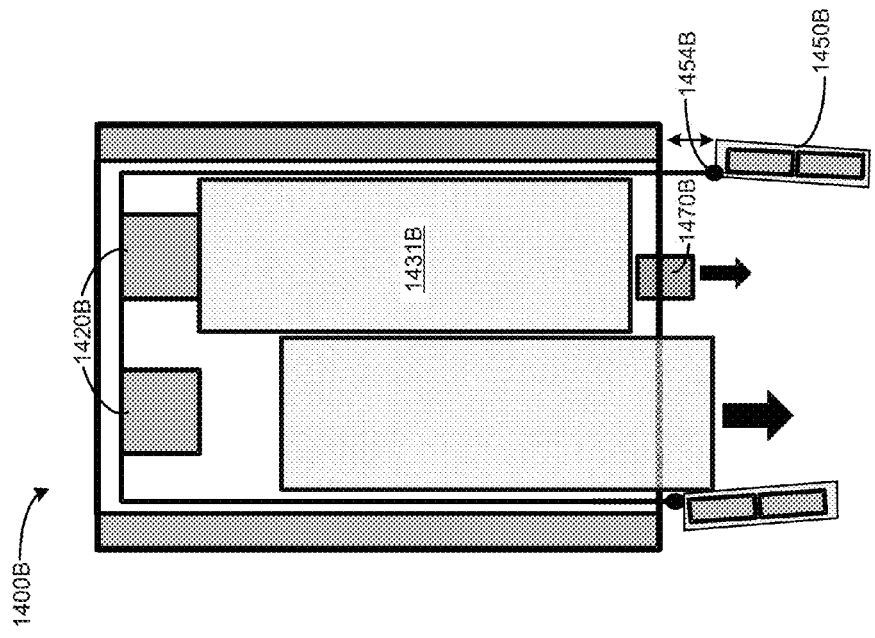
FIG. 14B is a top view block diagram of a system including a fan box according to an example.
Figure 14A:
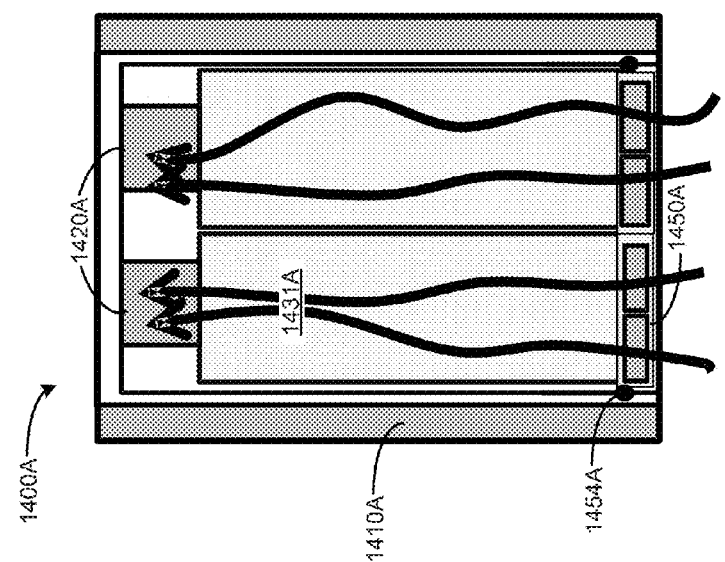
FIG. 14A is a top view block diagram of a system including a fan box according to an example.

FIG. 14A is a top view block diagram of a system 1400A including a fan box 1450A according to an example. Two half-width removable modules 1431A are shown. Air is supplied from first plenum 1410A for use by a door, but a door is not installed to redirect the air from the first plenum 1410A. Regardless, substantial airflow may still be provided to the removable module 1431A, based at least on the fan box 1450A and/or the second plenum 1420A. The fan box hinge 1454A is shown fully engaged with the rack frame system 1400A.

The fan boxes 1450A may be installed in front of the removable modules 1431A, to pressurize the removable modules 1431A. Cold air can be drawn in from the cold aisle without specifically needing air from the first plenum 1410A, and hot air can be exhausted to the hot aisle via the second plenum 1420A, and/or may be exhausted into chimney hot air plenums (not shown).

FIG. 14B is a top view block diagram of a system 1400B including a fan box 1450B according to an example. The removable module 1431B may be serviced and/or removed by pivoting and/or extending the fan box 1450B relative to the rack frame system 1400B. A removable module 1431B may remain installed and engaged to the second plenum 1420B, and the fan box 1450B may be opened to allow servicing and/or removal of a component 1470B (e.g., a disk drive) within the installed removable module 1431B. The fan box 1450B may be opened by pivoting the fan box 1450B and/or extending the fan box hinge 1454B away from the rack frame system 1400B. The half-width saloon doors and/or half-width pivotable fan boxes 1450B may be independently swung open, to access and/or service the half-width removable modules 1431B independently of each other.

FIG. 15A is a side view block diagram of a system 1500A including a front door 1540A and a rear door 1560A according to an example. The system 1500A may include a floor plenum 1509A, a removable module 1530A, an air mover 1564A, and a chimney 1565A. The floor plenum 1509A may be associated with a louvered or perforated floor tile. The front door 1540A may include a front door plenum 1542A and front door supply interface 1544A. The rear door 1560A may include a rear door plenum 1562A and a rear door exhaust interface 1549A.

The front door 1540A may include a plurality of front door exhaust interfaces 1548A to provide air to a plurality of removable modules 1530A. The front door plenum 1542A may include a front door baffle 1543A to provide constant air velocity from the plurality of front door exhaust interfaces 1548A.

The rear door 1560A may include a rear door plenum 1562A to receive air from the removable module 1530A to be exhausted from the rear door plenum 1562A. The rear door plenum 1562A may be coupled to an exhaust system including chimney 1565A, via the rear door exhaust interface 1549A (e.g., using a gasket, bellows, or other sealable interface). The exhaust system and/or chimney 1565A may include air mover 1564A.

Full-height rack doors 1540A and 1560A are shown in closed positions. The front door 1540A is to deliver cold air from the raised floor plenum 1509A to the individual removable modules 1530A in the rack frame system 1500A. The rear door 1560A may interface with a chimney to exhaust hot air from the rack frame system 1500A (e.g., exhaust to a row-level hot air plenums).

The front door 1540A, when opened, may disengage from floor plenum 1509A as well as the removable modules 1530A. When closed, the front door 1540A may engage back. The rear door 1560A, similarly, may engage/disengage. However, instead of engaging/disengaging with a floor plenum, the rear door 1560A may engage and disengage with an exhaust above the rear door 1560A. An air mover 1564A may be used to assist compressed air flow through the rear door plenum 1562A.

FIG. 15B is a side view block diagram of a system 1500B including a front door 1540B and a rear door 1560B according to an example. The front door 1540B is shown open, such that the front door supply interface 1544B is disengaged from the floor plenum 1509B and the front door exhaust interfaces 1548B are disengaged from the removable module 1530B. However, air is still passed through the removable module 1530B, based at least on the rear door plenum 1562B and/or the air mover 1564B. Thus, the front door 1540B may be opened without causing total loss of air movement through removable module 1530B.

Cold air may be available in a front of the rack frame system 1500B, when the front door 1540B is opened. Negative air pressure may develop in the removable modules 1530B, to pull some of the available cold air in front of the system 1500B. The front door exhaust interfaces 1548B are shown as a plurality of circles, but in alternate examples may be provided as a single orifice and/or as other shapes such as rectangular slits.

FIG. 15C is a side view block diagram of a system 1500C including a front door 1540C and a rear door 1560C according to an example. The rear door 1560C is shown open. However, airflow is provided through the removable module 1530C based at least on the floor plenum 1509C and/or the front door exhaust interface 1548C. Thus, the rear door 1560C may be opened without causing total loss of air movement through removable module 1530C.

The cold air from the floor plenum 1509C may be pumped and/or pressurized into the front door 1540C. An air mover (not shown) also may be used to provide air to the front door 1540C. Orifices in the front door 1540C may deliver air to the rack frame system 1500C cavity, to escape out the back of the rack frame system 1500C. Thus, air is still moved through the removable module 1530C, regardless whether either the front door 1540C or the rear door 1560C is open.

Figure 16:
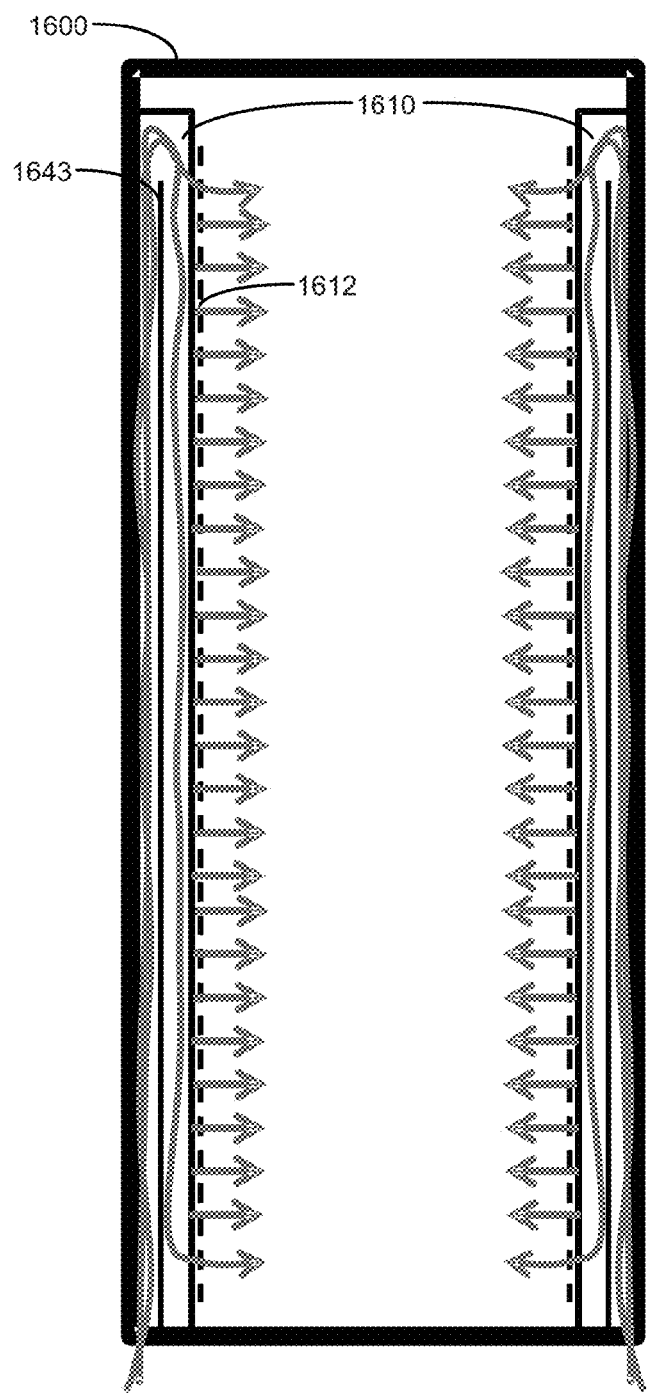
FIG. 16 is a front view block diagram of a system including a first plenum and baffle according to an example.

FIG. 16 is a front view block diagram of a rack frame system 1600 including a first plenum 1610 and baffle 1643 according to an example. The first plenum 1610 may provide a plurality of supply interfaces 1612 to interface with a plurality of removable modules (not shown) to be interfaced with the rack frame system 1600. The baffle 1643 may enable substantially constant velocity of air supplied by the plurality of supply interfaces 1612. The first plenums 1610 may be provided as sides of the system 1600. However, in an alternate example, the first plenums 1610 may be provided in a front door and rear door of rack frame system 1600, wherein air is supplied via the front and rear door (not shown). The baffles 1643 in each of the first plenums 1610 are designed to provide consistent air velocity and flow rate at every rack-U and/or at every device, as serviced by the supply interface 1612.

FIG. 17 is a flow chart 1700 based on supplying air and exhausting air in a system according to an example. In step 1710, air is supplied from a first plenum based on a blind-mate supply interface. The first plenum is to serve as a first structural member of a rack frame to structurally support a removable module. In step 1720, the supplied air is directed from the first plenum through a door plenum to the removable module. The door plenum is associated with a door of the rack frame. For example, the door may receive air from a floor plenum, a fan box, or other supply of air, in addition to receiving air from the first plenum. In step 1730, air is exhausted from the removable module to a second plenum based on a blind-mate exhaust interface. For example, the air may be exhausted and augmented based on an air mover. The second plenum is to serve as a second structural member of the rack frame to structurally support the removable module. In step 1740, the door is structurally supported based on at least one of the first plenum and the second plenum. For example, the door may include a door hinge that may slidably engage the first plenum and/or the second plenum, to enable the hinge to pivot and extend relative to the rack frame system.

Figure 18:
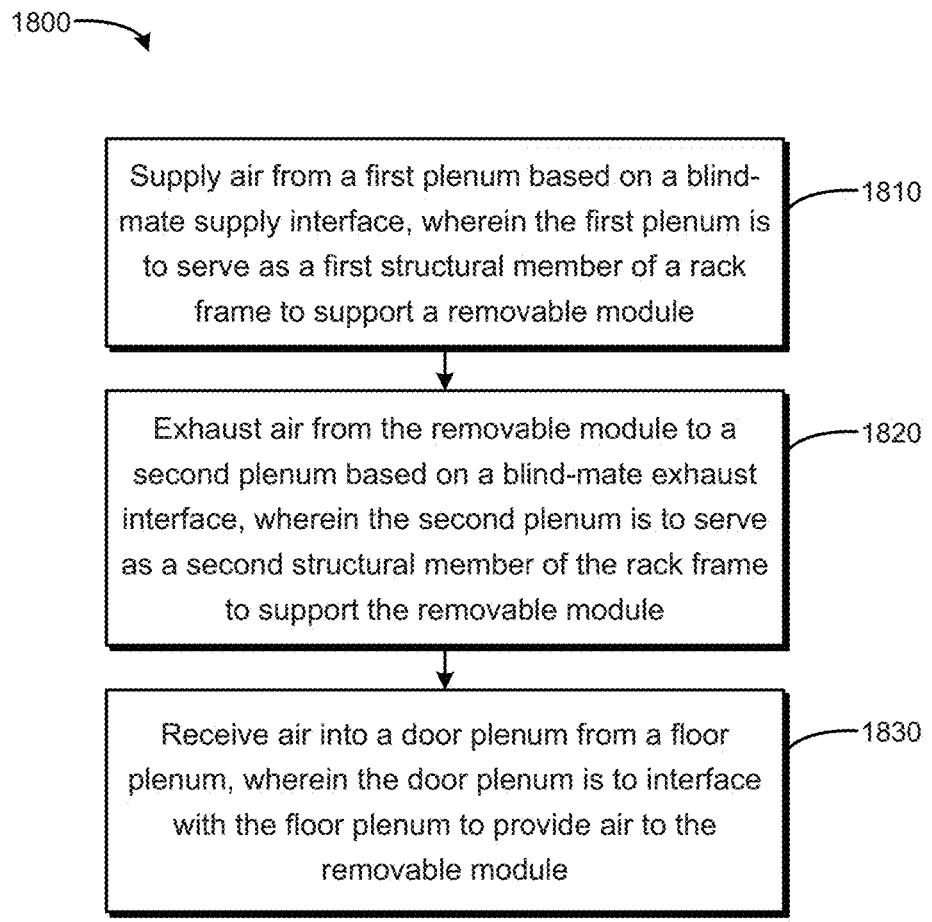
FIG. 18 is a flow chart based on supplying air and exhausting air in a system according to an example.

FIG. 18 is a flow chart 1800 based on supplying air and exhausting air in a system according to an example. In step 1810, air is supplied from a first plenum based on a blind-mate supply interface. The first plenum is to serve as a first structural member of a rack frame to support a removable module. In step 1820, air is exhausted from the removable module to a second plenum based on a blind-mate exhaust interface. The second plenum is to serve as a second structural member of the rack frame to support the removable module. In step 1830, air is received into a door plenum from a floor plenum. The floor plenum is to interface with the door plenum to provide air to the removable module.

What is claimed is:

1. A rack frame comprising:
   a first plenum to serve as a first structural member and to supply air from a supply interface; and
   a second plenum to serve as a second structural member and to exhaust air from an exhaust interface;
   wherein the first plenum is to structurally support and supply air for a removable module, and the second plenum is to structurally support and exhaust air from the removable module, and
   wherein the supply interface and the exhaust interface are based on bellows to couple with corresponding interfaces of the removable module based on insertion of the removable module into the rack frame.

2. The rack frame of claim 1, wherein at least one of the first plenum and second plenum is positioned to divide a width of at least a portion of the rack frame to provide a plurality of half-width bays to accommodate a plurality of airflow paths to the plurality of half-width bays.

3. The rack frame of claim 1, wherein the rack frame is to structurally support a door including a door plenum to receive air, wherein the door plenum is to supply the received air to the removable module.

4. The rack frame of claim 3, wherein the door is a segmented saloon door having a width corresponding to approximately a half-width removable module.

5. The rack frame of claim 3, wherein the door is hingedly supported based on a hinge having a pivot axis, wherein the hinge is extendably mounted to enable the door and pivot axis to be extended away from the rack frame.

6. The rack frame of claim 3, wherein the door includes a plurality of door exhaust interfaces to provide air to a plurality of removable modules, and the door plenum includes a door baffle to provide constant air velocity from the plurality of door exhaust interfaces.

7. The rack frame of claim 3, wherein the rack frame is to structurally support a fan box to provide airflow from the door plenum to the removable module, based on a fan box hinge including a fan box pivot axis, wherein the fan box hinge is extendably mounted to enable the fan box and fan box pivot axis to be extended away from the rack frame.

8. The rack frame of claim 7, wherein the fan box includes a fan box air baffle to direct airflow from the door plenum to the removable module.

9. The rack frame of claim 1, further comprising a rear door including a rear door plenum to receive air from the removable module to be exhausted from the rear door plenum.

* * * * *